United States Patent
Noh et al.

(10) Patent No.: US 10,438,977 B2
(45) Date of Patent: Oct. 8, 2019

(54) DISPLAY DEVICE

(71) Applicant: Samsung Display Co. Ltd., Yongin-si, Gyeonggi-do (KR)

(72) Inventors: Jung Hun Noh, Yongin-si (KR); Keun Kyu Song, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 154 days.

(21) Appl. No.: 15/499,651

(22) Filed: Apr. 27, 2017

(65) Prior Publication Data

US 2017/0317114 A1    Nov. 2, 2017

(30) Foreign Application Priority Data

Apr. 28, 2016    (KR) .................. 10-2016-0052181

(51) Int. Cl.
*H01L 29/786* (2006.01)
*H01L 27/12* (2006.01)

(52) U.S. Cl.
CPC ........ *H01L 27/1251* (2013.01); *H01L 27/124* (2013.01); *H01L 29/78633* (2013.01)

(58) Field of Classification Search
None
See application file for complete search history.

(56) References Cited

U.S. PATENT DOCUMENTS

| 7,956,942 | B2 | 6/2011 | Lee |
| 8,174,472 | B2 | 5/2012 | Lee |
| 8,810,745 | B2 | 8/2014 | Kim et al. |
| 2012/0153289 | A1* | 6/2012 | Kaneko ............ H01L 29/78633 257/59 |
| 2013/0300968 | A1* | 11/2013 | Okajima ........... G02F 1/136209 349/43 |
| 2013/0314636 | A1* | 11/2013 | Chen .................. G02F 1/13624 349/43 |
| 2016/0299385 | A1* | 10/2016 | Park ...................... H01L 27/124 |
| 2017/0186783 | A1* | 6/2017 | Hu ....................... H01L 27/1281 |

* cited by examiner

*Primary Examiner* — Ali Naraghi
(74) *Attorney, Agent, or Firm* — Innovation Counsel LLP

(57) ABSTRACT

A display device may include a first base substrate, a light-blocker, a gate wiring, a semiconductor member, a data wiring, and a drain electrode. The light-blocker is disposed on the first base substrate, and includes a light-blocking line extending in a first direction and a light-blocking protrusion protruding from the light-blocking line in a second direction different from the first direction. The gate wiring includes a gate line extending in the first direction and a gate electrode protruding from the gate line. The semiconductor member overlaps the gate electrode and includes a source region, a drain region, and a channel region. The data wiring extends in the second direction and is electrically connected to the source region. The drain electrode is electrically connected to the drain region. An edge of the gate electrode in the first direction is located in an overlap area between the drain region and the light-blocking protrusion.

19 Claims, 21 Drawing Sheets

DISPLAY DEVICE

This application claims the benefit of Korean Patent Application No. 10-2016-0052181, filed on Apr. 28, 2016, in the Korean Intellectual Property Office; the disclosure of the Korean Patent Application is incorporated herein by reference in its entirety.

BACKGROUND

1. Field

The technical field relates to a display device.

2. Description of the Related Art

In a display device, e.g., a liquid crystal display (LCD), voltages are applied to electrodes (pixel electrodes and a common electrode). Accordingly, the arrangement of light-controlling elements, e.g., liquid crystals of a liquid crystal layer, is controlled, such that transmission of light is controlled for displaying images.

The LCD includes a thin-film transistor connected to the electrodes. The thin-film transistor is used in the LCD as a switching device for controlling each pixel independently.

Specifically, in each pixel, the thin-film transistor controls a data signal provided to a pixel electrode through a data line according to a gate signal provided through a gate line. The thin-film transistor includes a gate electrode connected to the gate line, an active layer (a semiconductor layer) disposed on the gate electrode and providing a channel, a source electrode disposed on the active layer and connected to the data line, and a drain electrode separated from the source electrode and connected to the pixel electrode.

In the thin-film transistor, the gate electrode overlaps the source electrode and the drain electrode by certain widths in order to prevent light irradiated from a backlight unit located under a substrate from entering the active layer.

However, the gate electrode can form parasitic capacitance with the source electrode and/or the drain electrode. In particular, as an overlap area between the gate electrode and the drain electrode increases, the parasitic capacitance may increase. The increased parasitic capacitance can undesirably increase a kickback voltage in the pixel. The increase of the kickback voltage may cause an image displayed by the display device to flicker, resulting in unsatisfactory image display quality.

SUMMARY

Embodiments may be related to a display device having a minimum kickback voltage, such that image display quality associated with the display device may be satisfactory.

According to an embodiment, a display device may include the following elements: a first base substrate; a light-blocking pattern which is disposed on the first base substrate and comprises a light-blocking line extending along a first direction and a light-blocking protrusion protruding from the light-blocking line in a second direction intersecting the first direction; a gate wiring which comprises a gate line disposed on the light-blocking pattern to extend along the first direction and a gate electrode connected to the gate line and protruding along the second direction; a semiconductor pattern which is disposed on the gate wiring to overlap the gate electrode and comprises a source region, a channel region and a drain region; a data wiring which is disposed on the semiconductor pattern to extend along the second direction and electrically connected to the source region; and a drain electrode which is disposed on the semiconductor pattern to be separated from the data wiring, overlaps the light-blocking protrusion, and is electrically connected to the drain region, wherein the light-blocking protrusion partially overlaps the gate wiring, and an edge of the gate electrode in the first direction is located in an overlap area between the drain region and the light-blocking protrusion.

The display device may comprise: a pixel electrode which is disposed on the drain electrode and electrically connected to the drain electrode; and a common electrode which is located between the drain electrode and the pixel electrode and insulated from the drain electrode and the pixel electrode, wherein the common electrode is electrically connected to the light-blocking protrusion.

The gate electrode and the light-blocking protrusion may partially overlap each other, and a width by which the gate electrode and the light-blocking protrusion may overlap each other in the first direction is in the range of about 0.5 μm to about 3 μm.

The gate electrode and the light-blocking protrusion may partially overlap each other, and the light-blocking protrusion may completely overlap the semiconductor pattern in the second direction.

A distance between an edge of the semiconductor member and an edge of the light-blocking protrusion which face each other in the second direction may be in the range of about 1 μm to about 3 μm.

The drain electrode may completely overlap the light-blocking pattern.

The light-blocking line and the gate line may not overlap each other and may face each other with the light-blocking protrusion and the gate electrode interposed between the light-blocking line and the gate line.

The light-blocking line may not overlap the gate wiring layer, and the light-blocking protrusion may protrude in an opposite direction to a direction in which the gate electrode protrudes in the second direction.

The light-blocking line may overlap the gate line, and the light-blocking protrusion protrudes in the same direction as the gate electrode in the second direction.

The display device may comprise: a pixel electrode which is disposed on the drain electrode; a common electrode which is disposed between the drain electrode and the pixel electrode to be insulated from the drain electrode and the pixel electrode and comprises a first opening; and a common wiring which is disposed on the common electrode and comprises a connection part, wherein the pixel electrode is electrically connected to the drain electrode by the first opening, and the light-blocking pattern comprises a connection terminal connected to the light-blocking line.

The display device may further comprise a connection electrode which is disposed on the same layer as the pixel electrode, wherein the common electrode comprises a second opening which exposes the connection terminal, and the connection electrode electrically connects the connection terminal and the connection part through the second opening.

The common electrode may comprise a second opening which exposes the connection terminal, and the connection part is electrically connected to the connection terminal by the second opening.

The display device may further comprise: a buffer layer which is disposed between the light-blocking pattern and the gate wiring and comprises a contact hole exposing the connection terminal; and a connection electrode which is disposed on the same layer as the gate wiring and electrically connected to the connection terminal by the contact hole, wherein the common electrode comprises a second opening which exposes the connection electrode, and the connection part is electrically connected to the connection electrode by the second opening.

The display device may comprise: a gate insulating layer which is disposed between the light-blocking pattern and the data wiring and comprises a contact hole exposing the connection terminal; and a connection electrode which is disposed on the same layer as the data wiring and electrically connected to the connection terminal by the contact hole, wherein the common electrode comprises a second opening exposing the connection electrode, and the connection part is electrically connected to the connection electrode by the second opening.

The display device may further comprise a buffer layer which is disposed between the light-blocking pattern and the gate wiring, wherein the drain electrode contacts the buffer layer and overlaps the light-blocking pattern.

The display device may further comprise: a planarization layer which comprises a through hole exposing the drain electrode; a pixel electrode which is disposed on the planarization layer and electrically connected to the drain electrode by the through hole; an insulating layer which is disposed on the pixel electrode; and a common electrode which is disposed on the insulating layer.

The display device may further comprise: a planarization layer which comprises a first through hole exposing the drain electrode; a pixel electrode which is disposed on the planarization layer and electrically connected to the drain electrode by the first through hole; a common wiring which is disposed on the planarization layer to be insulated from the pixel electrode and comprises a contact part; a second base substrate which is separated from the first base substrate; a common electrode which is disposed on a surface of the second base substrate; and a conductor which is disposed between the common electrode and the connection part, wherein the light-blocking pattern comprises a connection terminal connected to the light-blocking line.

The planarization layer may comprise a second through hole which exposes the connection terminal, and the contact part is electrically connected to the connection terminal by the second through hole.

The display device may further comprise: a buffer layer which is disposed between the light-blocking pattern and the gate wiring and comprises a contact hole exposing the connection terminal; and a connection electrode which is disposed on the same layer as the gate wiring and electrically connected to the connection terminal by the contact hole, wherein the planarization layer comprises a second through hole exposing the connection electrode, and the connection part is electrically connected to the connection electrode by the second through hole.

The display device may further comprise: a gate insulating layer which is disposed between the light-blocking pattern and the data wiring and comprises a contact hole exposing the connection terminal; and a connection electrode which is disposed on the same layer as the data wiring and electrically connected to the connection terminal by the contact hole, wherein the planarization layer comprises a second through hole exposing the connection electrode, and the connection part is electrically connected to the connection electrode by the second through hole.

An embodiment may be related to a display device. The display device may include a first base substrate, a light-blocker, a gate wiring, a semiconductor member, a data wiring, and a drain electrode. The light-blocker may be formed of a conductive material, may be disposed on the first base substrate, and may include a light-blocking line extending in a first direction and a light-blocking protrusion protruding from the light-blocking line in a second direction different from the first direction. The gate wiring may include a gate line extending in the first direction and a gate electrode protruding from the gate line. The semiconductor member may overlap the gate electrode and may include a source region, a drain region, and a channel region between the source region and the drain region. The data wiring extends in the second direction and may be electrically connected to the source region. The drain electrode may be separated from the data wiring and may be electrically connected to the drain region. The light-blocking protrusion partially may overlap the gate electrode. An edge of the gate electrode may be located between the drain electrode and the light-blocking protrusion.

The display device of may include a pixel electrode and a common electrode. The pixel electrode may be electrically connected to the drain electrode. The common electrode may be located between the drain electrode and the pixel electrode, may be insulated from the drain electrode and the pixel electrode, and may be electrically connected to the light-blocking protrusion.

The gate electrode and the light-blocking protrusion may partially overlap each other. A width by which the gate electrode and the light-blocking protrusion overlap each other in the first direction may be in a range of 0.5 μm to 3 μm.

The gate electrode and the light-blocking protrusion may partially overlap each other. The light-blocking protrusion may completely overlap an edge of the semiconductor member that extends in the second direction.

The light-blocking protrusion may overlap whole of the drain region (i.e., an entire side of drain region).

Whole of the drain electrode (i.e., an entire side of the drain electrode) may overlap the light-blocker.

The light-blocking line and the gate line may be spaced from each other in a plan view of the display device. The light-blocking protrusion and the gate electrode may be positioned between the light-blocking line and the gate line in the plan view of the display device.

The display device may include a pixel electrode. A portion of the pixel electrode may directly contact the drain electrode and may be positioned right over the light-blocking protrusion.

The light-blocking line may overlap the gate line. The light-blocking protrusion may overlap the gate electrode.

The display device may include a pixel electrode, a common electrode, and a common wiring. The pixel electrode may be electrically connected to the drain electrode. The common electrode may be disposed between the drain electrode and the pixel electrode, may be insulated from the drain electrode and the pixel electrode, and may include a first opening. The common wiring may be electrically connected to the common electrode and may include a connection part. The pixel electrode may be electrically connected to the drain electrode through the first opening. The light-blocker may include a connection terminal electrically connected to the light-blocking line.

The display device may include a connection electrode. A material of the connection electrode may be identical to a material of the pixel electrode. The common electrode may include a second opening, which may expose the connection terminal. The connection electrode may extend through the second opening and may electrically connect the connection terminal to the connection part.

Two opposite sides of the connection part may be positioned between the common electrode and the connection electrode and may respectively directly contact the common electrode and the connection electrode.

The display device may include a buffer layer and a connection electrode. The buffer layer may be disposed between the light-blocker and the gate wiring and may include a contact hole exposing the connection terminal. The connection electrode may be formed of a same material as the gate wiring and may be electrically connected to the connection terminal through the contact hole.

The display device may include a gate insulating layer and a connection electrode. The gate insulating layer may be disposed between the light-blocker and the data wiring and may include a contact hole exposing the connection terminal. The connection electrode may be formed of a same material as the data wiring and may be electrically connected to the connection terminal through the contact hole.

The display device may include a buffer layer. The buffer layer may be disposed between the light-blocker and the gate wiring. A portion of the drain electrode may directly contact the buffer layer. Whole of the portion of the drain electrode (i.e., the entire portion of the drain electrode) may overlap the light-blocker.

The display device may include a planarization layer, a pixel electrode, an insulating layer, and a common electrode. The planarization layer may include a through hole exposing the drain electrode. The pixel electrode may be disposed on the planarization layer and may be electrically connected to the drain electrode through the through hole. The insulating layer may be disposed on the pixel electrode. A portion of the insulating layer may be positioned inside the through hole. The common electrode may be disposed on the insulating layer.

The display device may include a planarization layer, a pixel electrode, a common wiring, a second base substrate, a common electrode, and a conductor. The planarization layer may include a first through hole exposing the drain electrode. The pixel electrode may be disposed on the planarization layer and may be electrically connected to the drain electrode through the first through hole. The common wiring may be disposed on the planarization layer, may be insulated from the pixel electrode, and may include a connection part. The second base substrate may be separated from the first base substrate. The common electrode may be disposed on the second base substrate. The conductor may be disposed between the common electrode and the connection part. The light-blocker may include a connection terminal connected to the light-blocking line.

The planarization layer may include a second through hole, which may expose the connection terminal. The connection part may be electrically connected to the connection terminal through the second through hole.

The display device may include a buffer layer and a connection electrode. The buffer layer may be disposed between the light-blocker and the gate wiring and may include a contact hole exposing the connection terminal. The connection electrode may be formed of a same material as the gate wiring and may directly contact the connection terminal through the contact hole. The planarization layer may include a second through hole exposing the connection electrode. The connection part may be electrically connected to the connection electrode through the second through hole.

The display device may include a gate insulating layer and a connection electrode. The gate insulating layer may be disposed between the light-blocker and the data wiring and may include a contact hole exposing the connection terminal. The connection electrode may be formed of a same material as the data wiring and may be electrically connected to the connection terminal through the contact hole. The planarization layer may include a second through hole exposing the connection electrode. The connection part may be electrically connected to the connection electrode through the second through hole.

DETAILED DESCRIPTION

Example embodiments are described with reference to the accompanying drawings. Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively. In this application, "pattern" may mean "structure" or "member".

In this application, when a first element is referred to as being "on" a second element, the first element can be directly on the second element, or an intervening element may also be present between the first element and the second element. The same reference numbers may indicate identical components and/or analogous elements.

Figure 1:
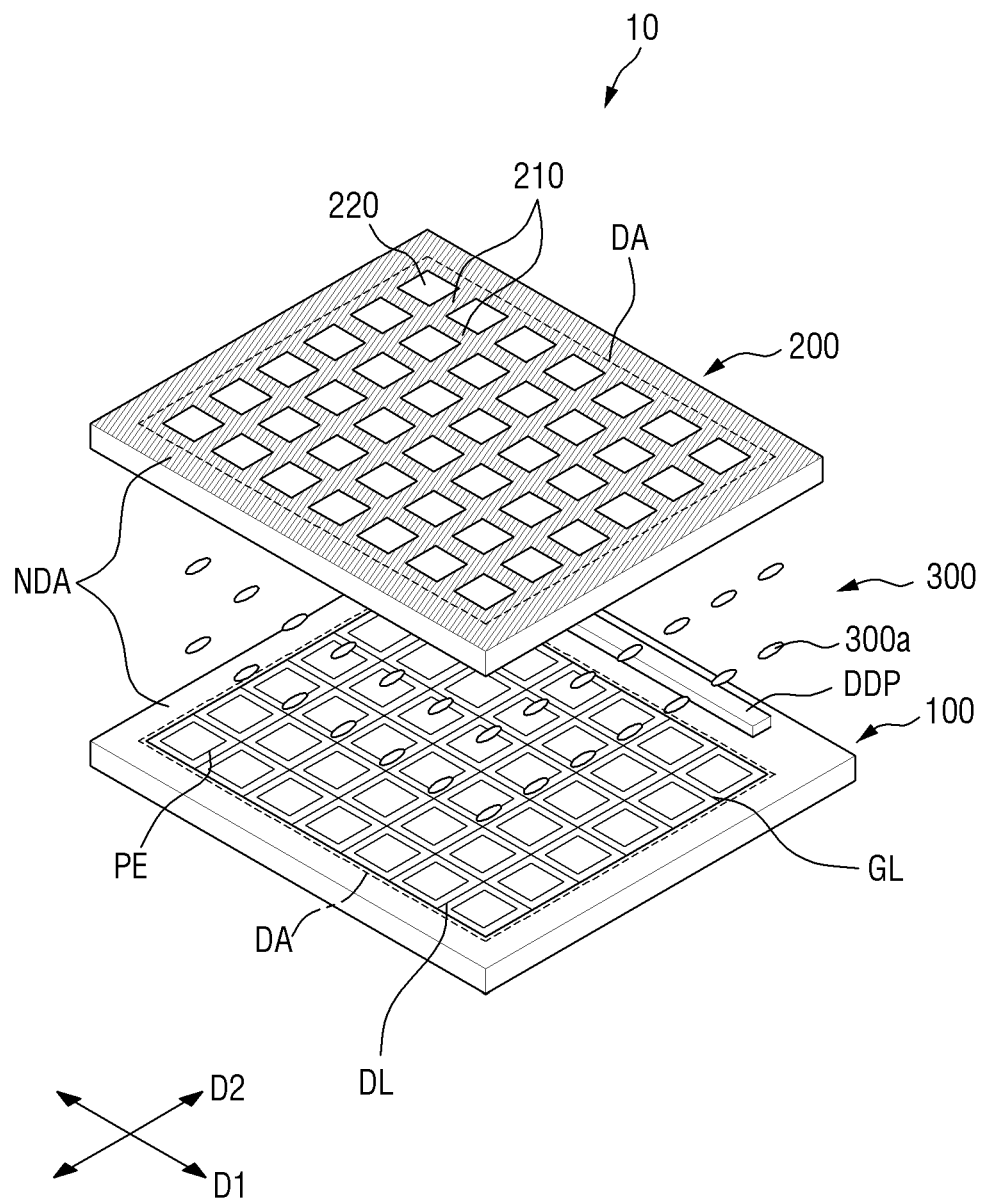
FIG. 1 is a schematic exploded perspective view of a display device according to an embodiment.

FIG. 1 is a schematic exploded perspective view of a display device 10 according to an embodiment.

Referring to FIG. 1, the display device 10 according to the current embodiment includes a first display substrate 100, a second display substrate 200 which faces the first display substrate 100, and a liquid crystal layer 300 which is disposed between the first display substrate 100 and the second display substrate 200.

Each of the first display substrate 100 and the second display substrate 200 includes a display area DA and a non-display area NDA located around the display area DA. The non-display area NDA may surround the display area DA. In the display area DA, a plurality of pixels are arranged in a matrix shape along a first direction D1 (or a row direction) and a second direction D2 (or a column direction) intersecting the first direction D1.

The display area DA includes a plurality of light-transmitting areas PA and a light-blocking area NPA disposed around the light-transmitting areas PA. Each of the light-transmitting areas PA is an area which transmits light to display an image, and the light-blocking area NPA is an area which overlaps, e.g., a light-blocking member 210 to block light. The light-transmitting areas PA are surrounded by the light-blocking area NPA. Each of the pixels includes at least one light-transmitting area PA and the light-blocking area NPA which surrounds the at least one light-transmitting area PA.

The first display substrate 100 includes a plurality of gate wirings GL and a plurality of data wirings DL disposed in both the display area DA and the non-display area NDA. In the display area DA, the gate wirings GL and the data wirings DL are disposed in the light-blocking area NPA.

The gate wirings GL and the data wirings DL intersect each other and are insulated from each other. Each of the gate wirings GL may extend in the first direction D1 along the boundaries of a plurality of pixels. The gate wirings GL may be connected to a gate driver (not illustrated) disposed in the non-display area NDA and may receive gate signals transmitted sequentially from the gate driver. Each of the data wirings DL may extend in the second direction D2 along the boundaries of a plurality of pixels. The data wirings DL may be connected to a data driver DDP disposed in the non-display area NDA and receive data signals from the data driver DDP.

A pixel electrode PE may be disposed in each pixel of the display area DA of the first display substrate 100. The pixel electrode PE is disposed in each of the light-transmitting areas PA of the display area DA. The pixel electrode PE may receive a data voltage through a thin-film transistor TFT1 (see FIG. 2). In addition, a common electrode (not illustrated) may be disposed on the whole surface of the display area DA of the first display substrate 100. The common electrode (not illustrated) may be disposed not only in the light-transmitting areas PA but also in the light-blocking area NPA of the display area DA. The pixel electrode PE and the common electrode (not illustrated) may generate an electric field, thereby controlling the arrangement direction of liquid crystals 300a of the liquid crystal layer 300.

The gate driver (not illustrated) which provides a gate signal to each pixel of the display area DA and the data driver DDP which provides a data signal to each pixel of the display area DA may be disposed in the non-display area NDA of the first display substrate 100.

A color filter 220 may be disposed in each pixel of the display area DA of the second display substrate 200. The color filter 220 may be disposed in each of the light-transmitting areas PA. The color filter 220 may include any one of a red color filter, a green color filter, and a blue color filter. The red color filter, the green color filter, and the blue color filter may be arranged alternately. The light-blocking member 210 may be disposed at a boundary between each pair of adjacent color filters 220. The light-blocking member 210 may be disposed in the light-blocking area NPA and overlap the gate wirings GL and the data wirings DL of the first display substrate 100. The light-blocking member 210 may extend up to the non-display area NDA of the second display substrate 200.

The first display substrate 100 and the second display substrate 200 may be bonded together by a sealing member (not illustrated) made of, e.g., a sealant. The sealing member may be located in a peripheral area, i.e., the non-display area NDA of each of the first display substrate 100 and the second display substrate 200.

The liquid crystal layer 300 includes the liquid crystals 300a. The liquid crystals 300 are disposed between the first display substrate 100 and the second display substrate 200 and confined by the sealing member. The liquid crystal layer 300 may be disposed in both the display area DA and the on-display area NDA.

Figure 2:
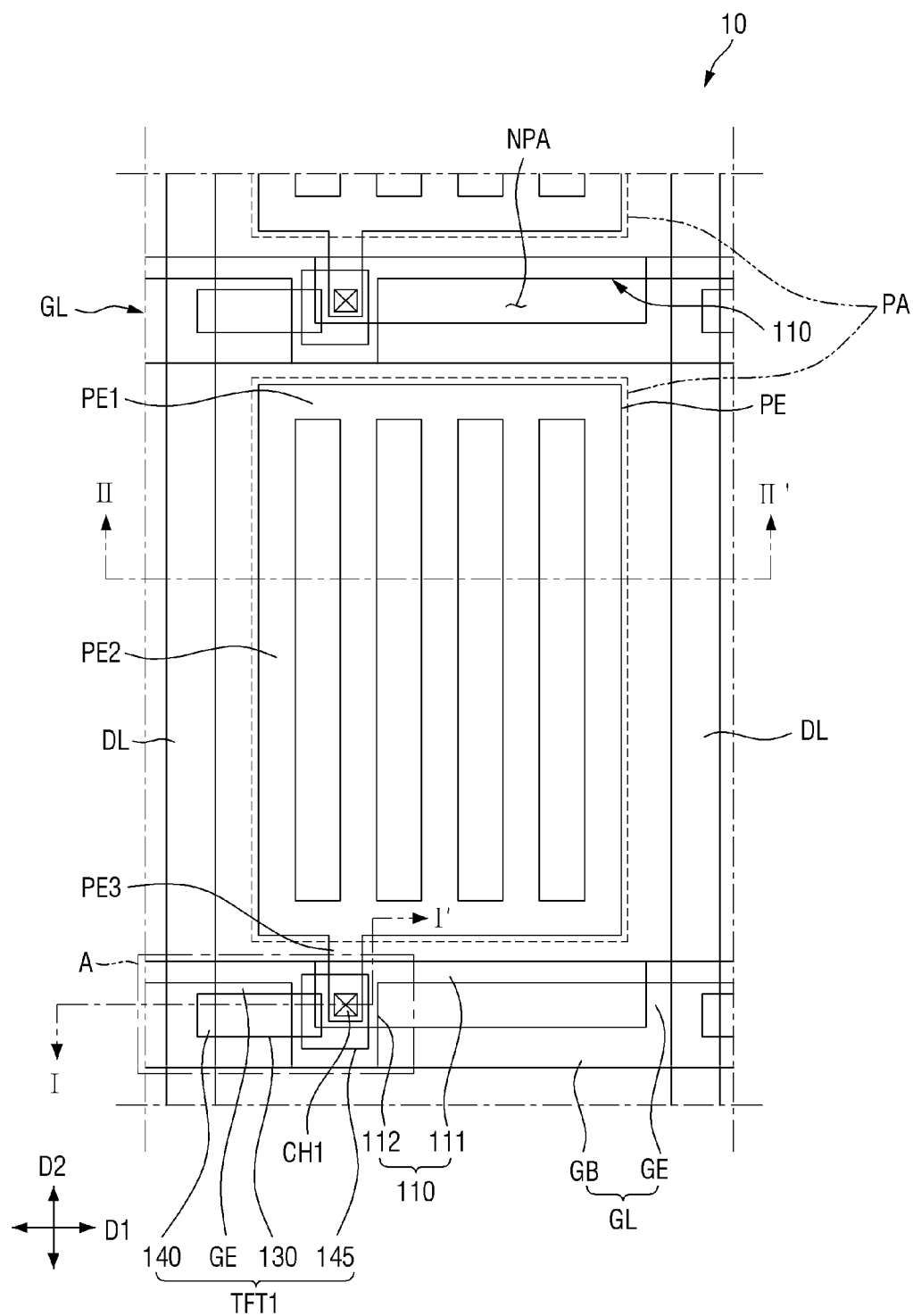
FIG. 2 is a layout view of a pixel illustrated in FIG. 1 according to an embodiment.
Figure 3:
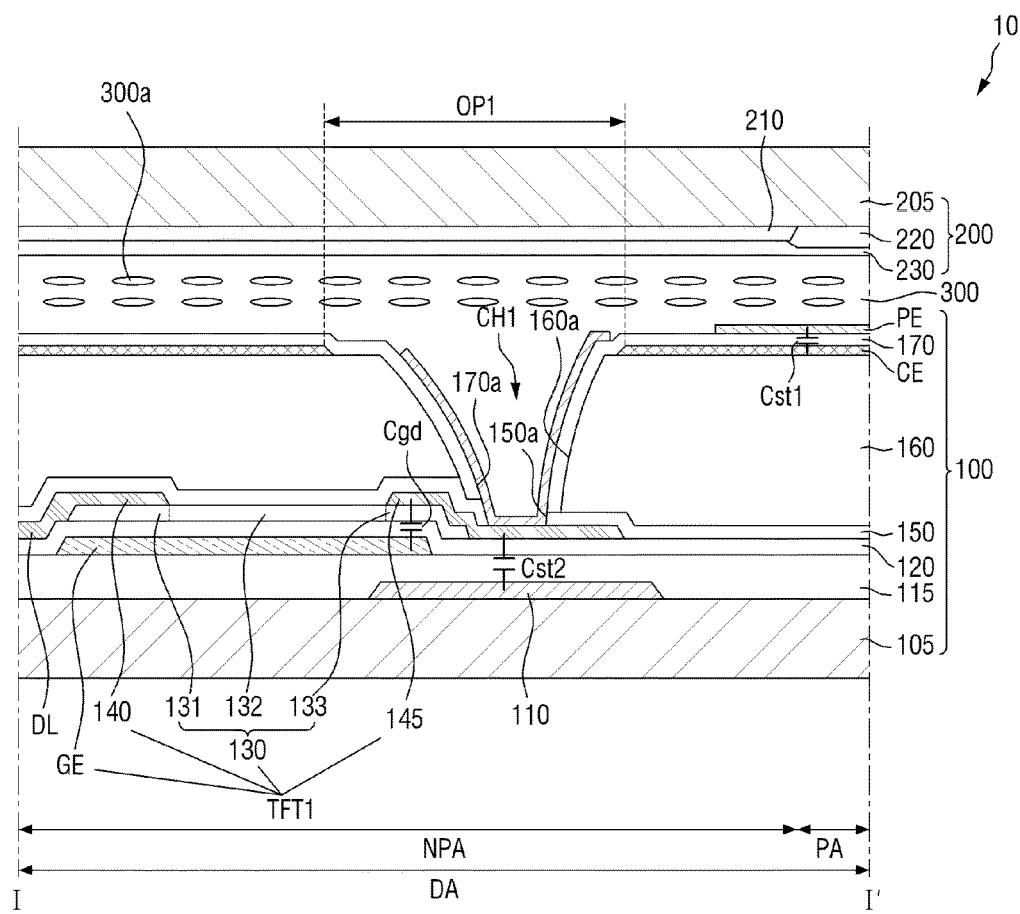
FIG. 3 is a cross-sectional view taken along the line I-I' of FIG. 2 according to an embodiment.
Figure 4:
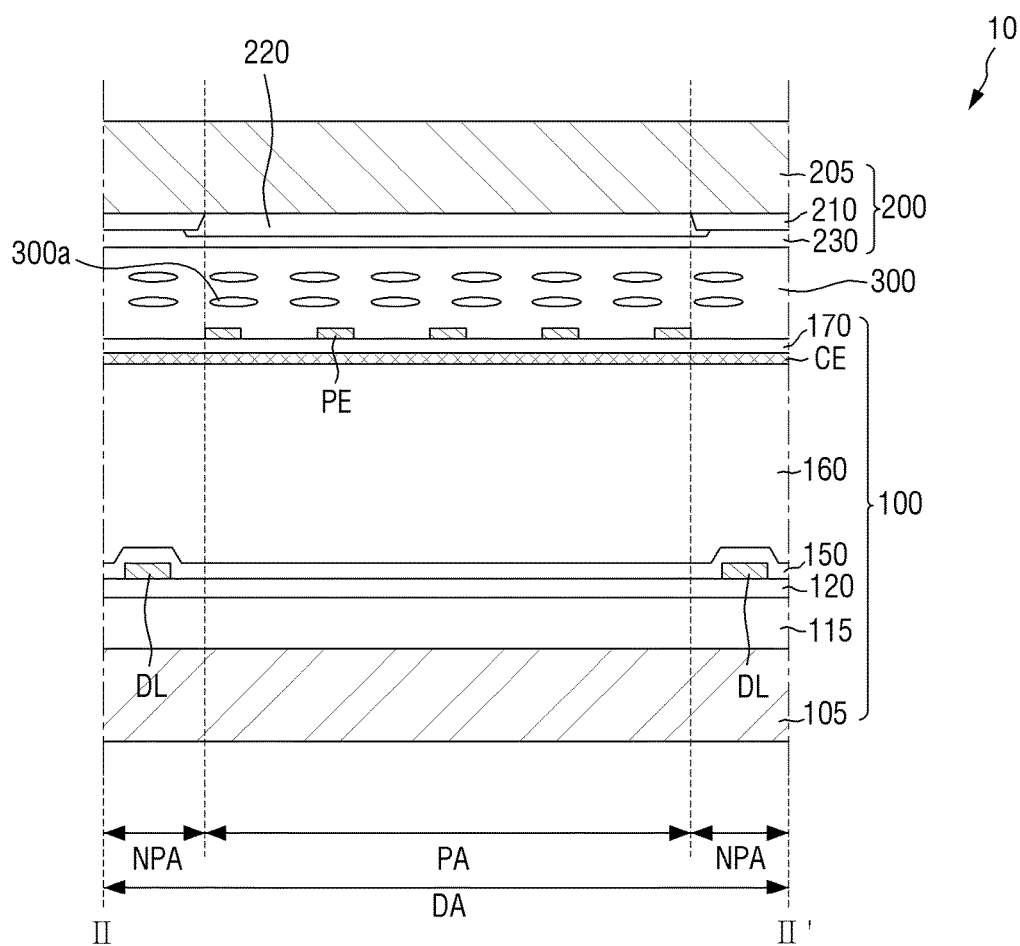
FIG. 4 is a cross-sectional view taken along the line II-II' of FIG. 2 according to an embodiment.
Figure 5:
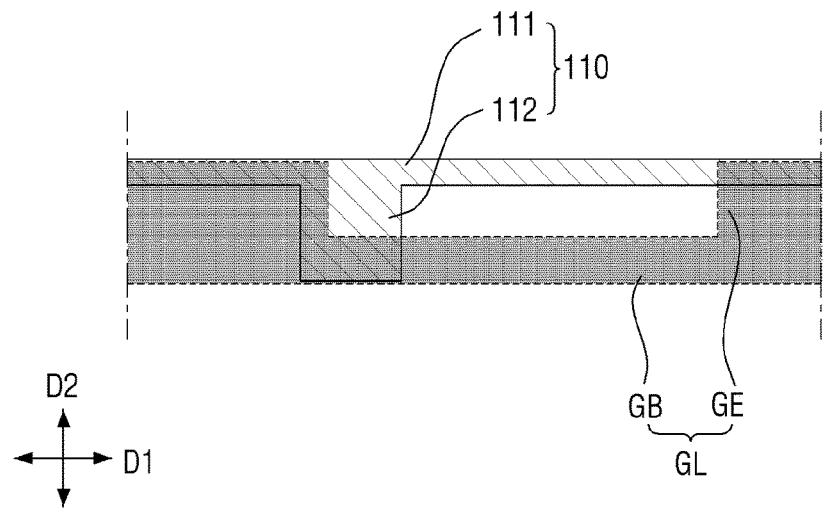
FIG. 5 is a layout view illustrating the positional relationship between a gate wiring and a light-blocking pattern of FIG. 2 according to an embodiment.
Figure 6:
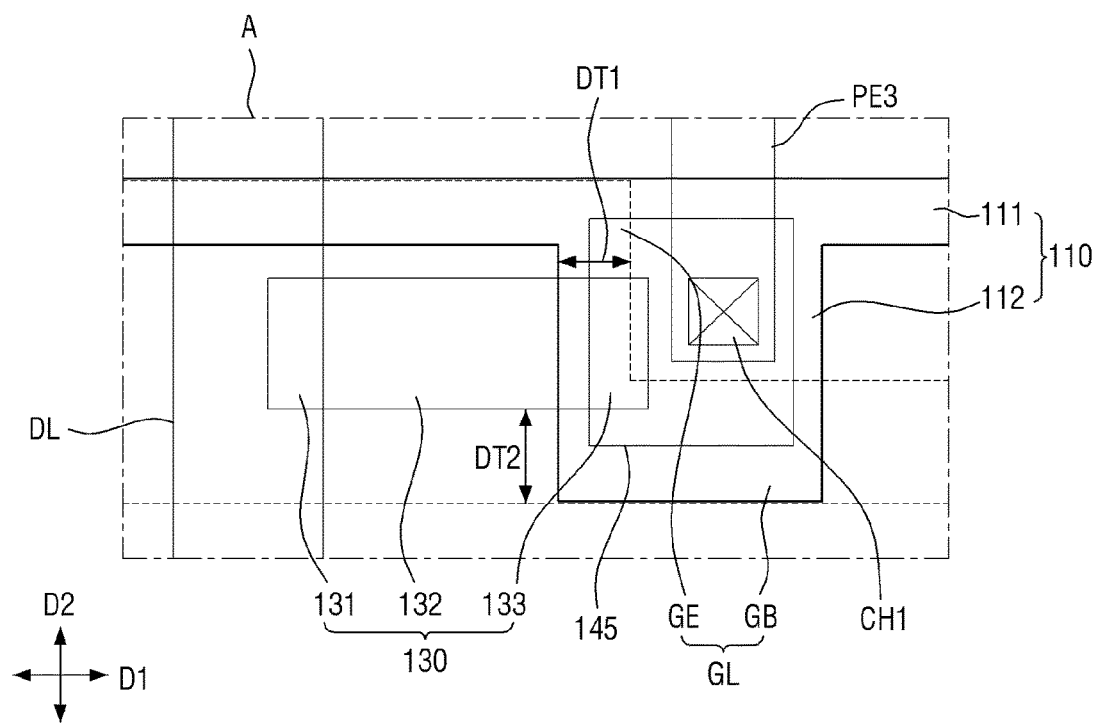
FIG. 6 is an enlarged layout view of a portion 'A' of FIG. 2 according to an embodiment.

FIG. 2 is a layout view of a pixel illustrated in FIG. 1. FIG. 3 is a cross-sectional view taken along the line I-I' of FIG. 2. FIG. 4 is a cross-sectional view taken along the line II-II' of FIG. 2. FIG. 5 is a layout view illustrating the positional relationship between a gate wiring GL and a light-blocking pattern 110 of FIG. 2. FIG. 6 is an enlarged layout view of a portion 'A' of FIG. 2.

The structure of each pixel of the display device 10 will now be described in greater detail with reference to FIGS. 2 through 6 by using one pixel as an example.

The first display substrate 100 will now be described.

The first display substrate 100 includes a first base substrate 105, the light-blocking pattern 110, a buffer layer 115, the gate wiring GL, a gate insulating layer 120, a semiconductor pattern 130, a data wiring DL, a drain electrode 145, an interlayer insulating film 150, a planarization layer 160, a common electrode CE, an insulating layer 170, and a pixel electrode PE.

The first base substrate 105 may be made of a material having superior light-transmitting, heat-resistant, and chemically resistant properties. For example, the first base substrate 105 may include at least one of glass, quartz, polyimide, polyethylene naphthalate, polyethylene terephthalate and polyacryl having superior light-transmitting properties.

The light-blocking pattern 110 is located on the first base substrate 105 and in the light-blocking area NPA. One light-blocking pattern 110 may be disposed in each row of pixels. The light-blocking pattern 110 receives a common voltage through a common wiring CL (see FIG. 7). The electrical connection structure between the light-blocking pattern 110 and the common wiring CL (see FIG. 7) will be described later.

The light-blocking pattern 110 may be made of an opaque metallic material, e.g., any one of molybdenum (Mo), chrome (Cr), copper (Cu), tantalum (Ta) and aluminum (Al). The light-blocking pattern 110 may include a light-blocking line 111 extending along the first direction D1 and a light-blocking protrusion 112 protruding from the light-blocking line 111 in the second direction D2.

The light-blocking line 111 of the light-blocking pattern 110 has a predetermined width and extends in the first direction D1. The light-blocking line 111 of the light-blocking pattern 110 may partially overlap a gate electrode GE.

The light-blocking protrusion 112 of the light-blocking pattern 110 may be disposed in each pixel. That is, in each pixel, one light-blocking protrusion 112 may protrude from the light-blocking line 111 of the light-blocking pattern 110 in the second direction D2. In an exemplary embodiment, the light-blocking protrusion 112 of the light-blocking pattern 110 may protrude in an opposite direction to a direction in which the gate electrode GE protrudes.

The light-blocking protrusion 112 of the light-blocking pattern 110 blocks light irradiated from a backlight unit located under the first base substrate 105 from entering the semiconductor pattern 130. The light-blocking protrusion 112 of the light-blocking pattern 110 may partially overlap the drain electrode 145 which will be described later. In addition, the light-blocking protrusion 112 may partially overlap the gate wiring GL by a predetermined width. That is, the light-blocking protrusion 112 may include a portion which overlaps the gate wiring GL and a portion which does not overlap the gate wiring GL.

The buffer layer 115 is disposed on the first base substrate 105 to cover the light-blocking pattern 110. The buffer layer 115 may be disposed on the whole surface of the first base substrate 105. The buffer layer 115 may be made of an insulating material such as silicon nitride or silicon oxide.

The gate wiring GL is located on the buffer layer 115 and in the light-blocking area NPA. The gate wiring GL may include a gate line GB extending along the first direction D1 and the gate electrode GE connected to the gate line GL and protruding along the second direction D2. As described above, the direction in which the gate electrode GE of the gate wiring GL protrudes may be opposite to the direction in which the light-blocking protrusion 112 of the light-blocking pattern 110 protrudes.

The gate line GB may not overlap the light-blocking line 111 of the light-blocking pattern 110 and may face the light-blocking line 111 of the light-blocking pattern 110 with the gate electrode GE and the light-blocking protrusion 112 interposed between them. The gate electrode GE may be provided in a plurality of along the first direction D1. For example, one gate electrode GE may be disposed in each pixel, and each gate electrode GE may be separated from another gate electrode GE by a predetermined gap along the first direction D1.

Referring to FIGS. 5 and 6, the gate electrode GE and the light-blocking protrusion 112 of the light-blocking pattern 110 may partially overlap each other. a width by which the gate electrode GE and the light-blocking protrusion 112 of the light-blocking pattern 110 overlap each other in the first direction D1, that is, a distance DT1 between an edge of the gate electrode GE and an edge of the light-blocking protrusion 112 with an overlap area between the gate electrode GE and the light-blocking protrusion 112 interposed between them may be in a range of about 0.5 μm to about 3 μm. If the gate electrode GE and the light-blocking protrusion 112 of the light-blocking pattern 110 overlap each other by a width in a range of about 0.5 μm to about 3 μm, a process margin is secured, thus reducing the probability that the gate electrode GE and the light-blocking protrusion 112 will be separated from each other. Accordingly, this can stably prevent light from the backlight unit (not illustrated) located under the first base substrate 105 from entering the semiconductor pattern 130 through a gap between the gate electrode GE and the light-blocking protrusion 112.

In addition, to stably prevent light of the backlight unit from entering the semiconductor pattern 130, the light-blocking protrusion 112 may protrude further beyond the semiconductor pattern 130 in its protruding direction (the second direction D2) such that it can completely overlap the semiconductor pattern 130 and have a certain margin. A distance DT2 between an end of the light-blocking protrusion 112 and an end of the semiconductor pattern 130 which faces the end of the light-blocking protrusion 112 may be in a range of about 1 μm to about 3 μm. In this range, light of the backlight unit can be more completely prevented from entering the semiconductor pattern 130.

The gate wiring GL may be made of a metal, such as copper (Cu), molybdenum (Mo), aluminum (Al), tungsten (W), chrome (Cr) or titanium (Ti), or an alloy including at least one of these metals.

The gate insulating layer 120 is disposed on the first base substrate 105 to cover the gate wiring GL. The gate insulating layer 120 may be disposed in both the display area DA and the non-display area NDA. The gate insulating layer 120 may be made of an insulating material such as silicon nitride, silicon oxide, or silicon oxynitride.

The semiconductor pattern 130 is located on the gate insulating layer 120 and in the light-blocking area NPA. The semiconductor pattern 130 may be disposed on the gate insulating layer 120 to overlap the gate electrode GE. The semiconductor pattern 130 may be made of amorphous silicon or polycrystalline silicon. In addition, the semiconductor pattern 130 may be made of an oxide semiconductor material. The oxide semiconductor material may be an oxide containing oxygen (O) and one or more elements selected from gallium (Ga), indium (In), zinc (Zn) and tin (Sn). Specifically, the oxide semiconductor material may include zinc oxide (ZnO), zinc tin oxide (ZTO), zinc indium oxide (ZIO), indium oxide (InO), titanium oxide (TiO), indium gallium zinc oxide (IGZO) or indium zinc tin oxide (IZTO).

The semiconductor pattern 130 may be divided into a source region 131, a channel region 132 and a drain region 133 formed integrally with each other. The source region 131 is overlapped by a source electrode 140 disposed on the source region 131, and the drain region 133 is overlapped by the drain electrode 145 disposed on the drain region 133. The channel region 132 is located between the source region 131 and the drain region 133 and is not covered by the data wiring DL.

When seen from above, an end of the gate electrode GE in the first direction D1 may be located in an overlap area between the drain region 133 of the semiconductor pattern 130 and the light-blocking protrusion 112 of the light-blocking pattern 110.

The data wiring DL is disposed on the semiconductor pattern 130 and the gate insulating layer 120. The data wiring DL is disposed in the light-blocking area NPA. The data wiring DL is located on the first base substrate 105, extends along the second direction D2, and intersects the gate wiring GL to be insulated from the gate wiring GL. A portion of the data wiring DL may overlap the light-blocking pattern 110, the source region 131 of the semiconductor pattern 130, and a portion of the gate wiring GL which includes the gate electrode GE. A portion of the data wiring DL which overlaps the source region 131 of the semiconductor pattern 130 may be defined as the source electrode 140. The source electrode 140 may be located in an area of the data wiring DL which intersects the gate wiring GL. The source electrode 140 may be physically and electrically connected to the source region 131 of the semiconductor pattern 130.

The drain electrode 145 is disposed on the semiconductor pattern 130 to be separated from the source electrode 140 and contacts and overlaps the drain region 133 of the semiconductor pattern 130. In addition, the drain electrode 145 partially overlaps the gate electrode GE and completely overlaps the light-blocking pattern 110.

The presence of the light-blocking protrusion 112 of the light-blocking pattern 110 may reduce an area by which the gate wiring GL overlaps the semiconductor pattern 130 and part of the drain electrode 145. Therefore, parasitic capacitance Cgd formed by the overlap of the gate wiring GL and the drain electrode 145 can be reduced, which, in turn, reduces the magnitude of a kickback voltage.

In addition to a storage capacitor Cst1 formed by the pixel electrode PE and the common electrode CE, an additional storage capacitor Cst2 is formed by the light-blocking protrusion 112 and the drain electrode 145. Therefore, the magnitude of the kickback voltage can further be reduced.

The data wiring DL and the drain electrode 145 may be made of a metal, such as copper (Cu), molybdenum (Mo), aluminum (Al), tungsten (W), chrome (Cr) or titanium (Ti), or an alloy including at least one of these metals.

The gate electrode GE, the semiconductor pattern 130, the source electrode 140 and the drain electrode 145 may form a thin-film transistor TFT1 which is a switching device.

The interlayer insulating film 150 is disposed in the display area DA and the non-display area NDA (see FIG. 1). The interlayer insulating film 150 may be disposed on the gate insulating layer 120 to cover the data wiring DL, the semiconductor pattern 130 and the drain electrode 145. The interlayer insulating film 150 may be made of an insulating material such as silicon nitride, silicon oxide, or silicon oxynitride. The interlayer insulating film 150 may further include a through hole 150a which exposes the drain electrode 145.

The planarization layer 160 is disposed in the display area DA and the non-display area NDA (see FIG. 1). The planarization layer 160 may be disposed on the interlayer insulating film 150. The planarization layer 160 may be made of an organic insulating material such as acrylic epoxy silicone. The planarization layer 160 may further include a through hole 160a which exposes the drain electrode 145.

The common electrode CE is disposed in the display area DA and may extend up to the non-display area NDA. The common electrode CE may be located on the planarization layer 160. The common electrode CE may receive the common voltage through the common wiring CL (see FIG. 7) including a connection part CLcon (see FIG. 8). In addition, the common electrode CE may be electrically connected to the light-blocking pattern 110 by the common wiring CL (see FIG. 7). Since the common electrode CE is electrically connected to the light-blocking pattern 110, the total resistance of the common electrode CE can be reduced. In addition, a ripple phenomenon in which the common voltage applied to the common electrode CE fluctuates when the data voltage applied to the pixel electrode PE swings can be reduced.

The common electrode CE includes a first opening OP1 which overlaps the through hole 160a of the planarization layer 160. The first opening OP1 is actually an area in which the common electrode CE is not disposed. The through hole 160a of the planarization layer 160 may completely overlap the first opening OP1. The planar area of the first opening OP1 may be larger than that of the through hole 160a of the planarization layer 160.

The common electrode CE may be made of a transparent conductive material such as indium tin oxide (ITO), indium zinc oxide (IZO), or zinc oxide (ZO).

The insulating layer 170 is disposed in the display area DA and the non-display area NDA (see FIG. 1). The insulating layer 170 may be disposed on the common electrode CE. The insulating layer 170 may be made of an insulating material such as silicon nitride, silicon oxide, or silicon oxynitride. The insulating layer 170 may include a through hole 170a which exposes the drain electrode 145. The insulating layer 170 may cover, but not necessarily, inner sidewalls of the through hole 160a.

The through hole 150a of the interlayer insulating film 150, the through hole 160a of the planarization layer 160, the through hole 170a of the insulating layer 170, and the first opening OP1 of the common electrode CE may form a contact hole CH1 which connects the pixel electrode PE to the drain electrode 145. The contact hole CH1 may overlap the light-blocking protrusion 112 of the light-blocking pattern 110 in the light-blocking area NPA of the first base substrate 105.

The pixel electrode PE is disposed on the insulating layer 170 to be insulated from the common electrode CE and located in each pixel. Specifically, the pixel electrode PE is located on the insulating layer 170 in each of the light-transmitting areas PA and is connected to the drain electrode 145 by the contact hole CH1.

In an exemplary embodiment, when seen from above, the pixel electrode PE may include at least one stem part PE1, a plurality of branch parts PE2 which protrude from the stem part PE1, and an extension part PE3 which connects the stem part PE1 and the drain electrode 145. The branch electrodes PE2 are separated from each other by a predetermined distance. The branch parts PE2 may extend parallel to each other in a predetermined direction. The stem part PE1 and the branch parts PE2 may not necessarily be arranged as illustrated in FIG. 2 but can be arranged in various forms. For example, the branch parts PE2 may protrude from the stem part PE1 in a direction. Alternatively, the branch parts PE2 may protrude in both directions perpendicular to the direction in which the stem part PE1 extends. Alternatively, the stem part PE1 or the branch parts PE2 may be bent multiple times.

The pixel electrode PE may be made of a transparent conductive material such as indium tin oxide (ITO), indium zinc oxide (IZO), or zinc oxide (ZO).

The second display substrate 200 will now be described.

The second display substrate 200 may include a second base substrate 205, a light-blocking member 210, a color filter 220, and an overcoating layer 230.

The second base substrate 205 faces the first base substrate 105. The second base substrate 205 may be made of a material having superior light-transmitting, heat-resistant, and chemically resistant properties. For example, the second base substrate 205 may include at least one of glass, quartz, polyimide, polyethylene naphthalate, polyethylene terephthalate and polyacryl having superior light-transmitting properties.

The light-blocking member 210 is disposed on a surface of the second base substrate 205 which faces the first display substrate 100. The light-blocking member 210 is disposed in the light-blocking area NPA. The light-blocking member 210 may overlap the light-blocking pattern 110, the gate wiring GL, the thin-film transistor TF1, and the data wiring DL. The light-blocking member 210 may be made of a light-blocking material to prevent the leakage of light or color mixture.

The color filter 220 is disposed on the surface of the second base substrate 205. The color filter 220 may be disposed in each of the light-transmitting areas PA and overlap the pixel electrode PE.

The overcoating layer 230 may be disposed on the surface of the second base substrate 205 to cover the light-blocking member 210 and the color filter 220. The overcoating layer 230 may prevent the color filter 220 from being exposed to the liquid crystal layer 300 and provide a flat surface. The overcoating layer 230 may be made of an acrylic epoxy material.

The electrical connection structure of the light-blocking pattern 110 and the common wiring CL of the display device 10 will hereinafter be described in detail.

Figure 7:
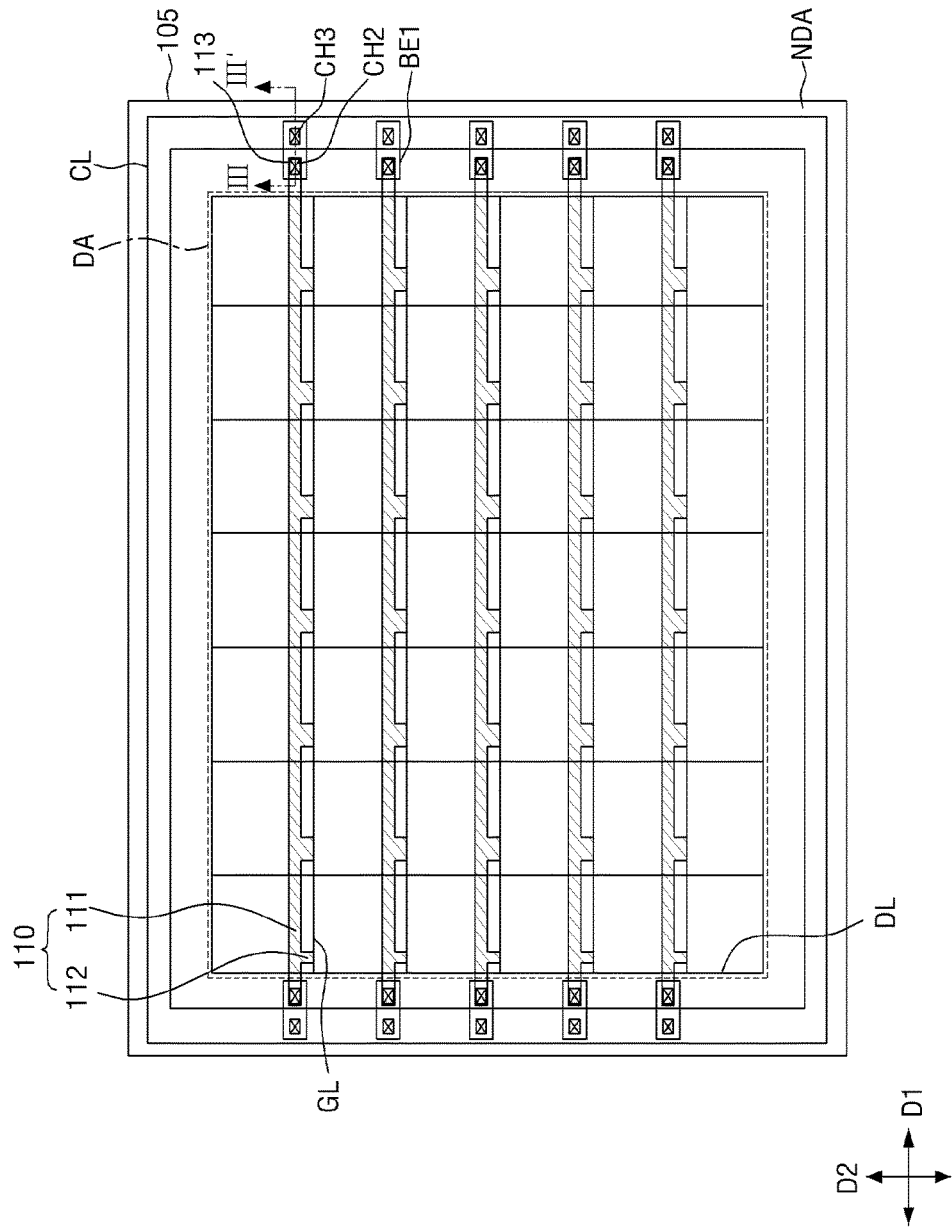
FIG. 7 is a schematic layout view illustrating the electrical connection structure of the light-blocking pattern and a common wiring of FIG. 2 according to an embodiment.
Figure 8:
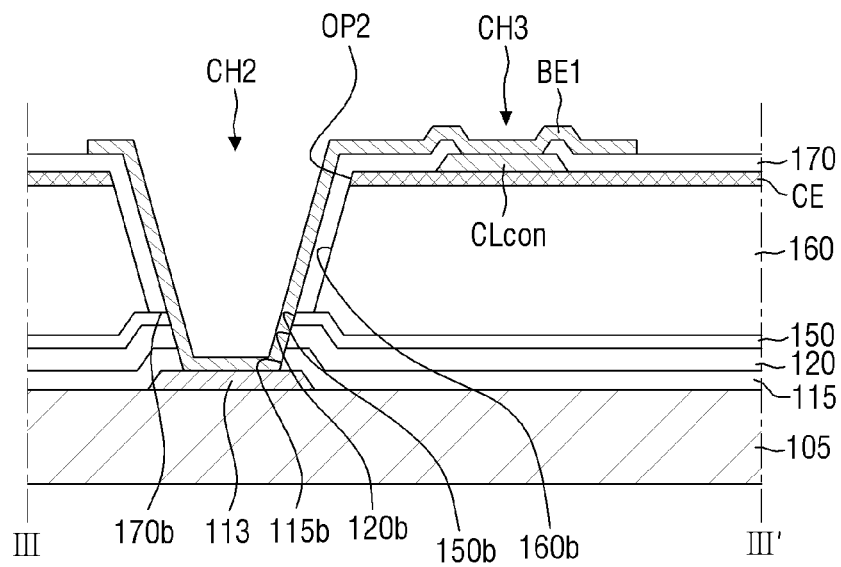
FIG. 8 is a cross-sectional view taken along the line III-III' of FIG. 7 according to an embodiment.
Figure 9:
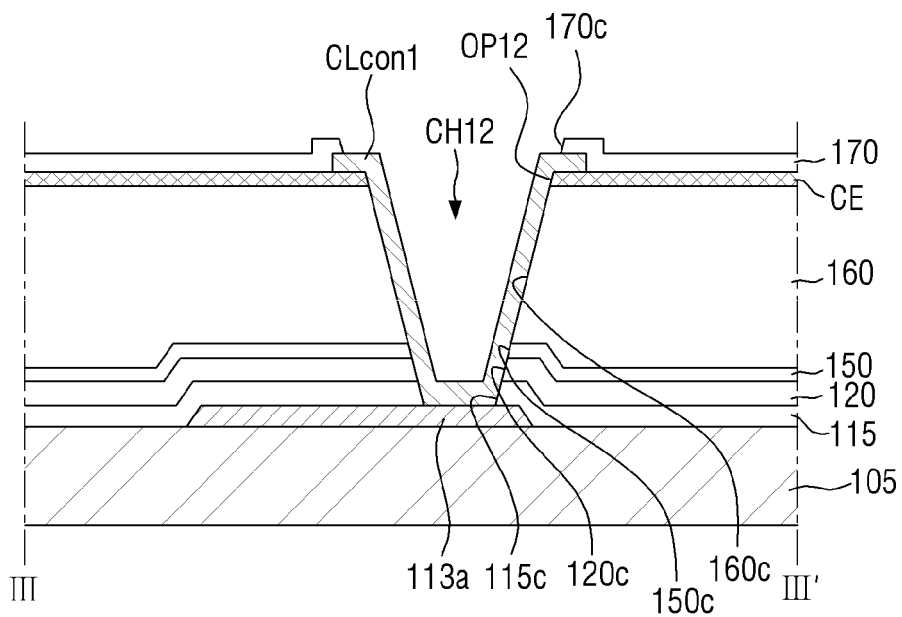
FIG. 9, FIG. 10, and FIG. 11 are cross-sectional views illustrating various embodiments of electrical connection structures of the light-blocking pattern and the common wiring of FIG. 8.
Figure 10:
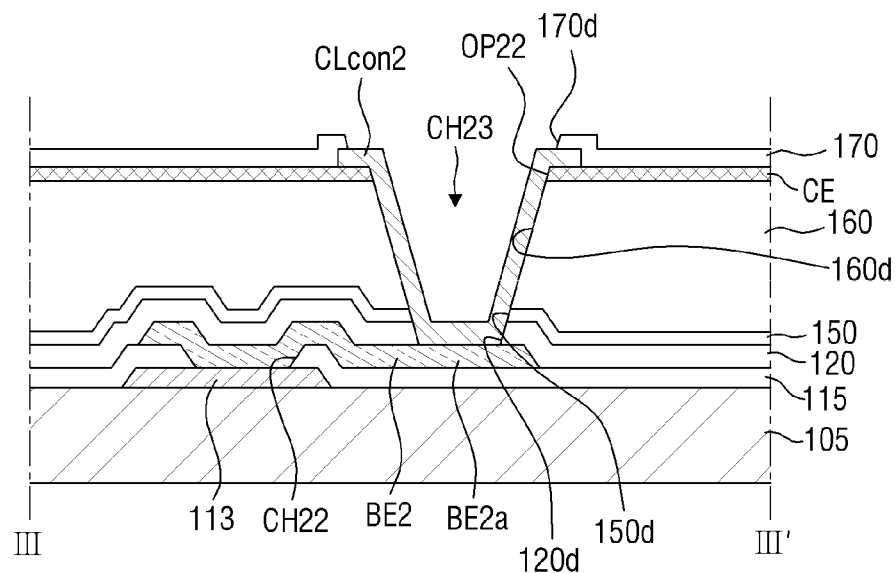
Figure 11:
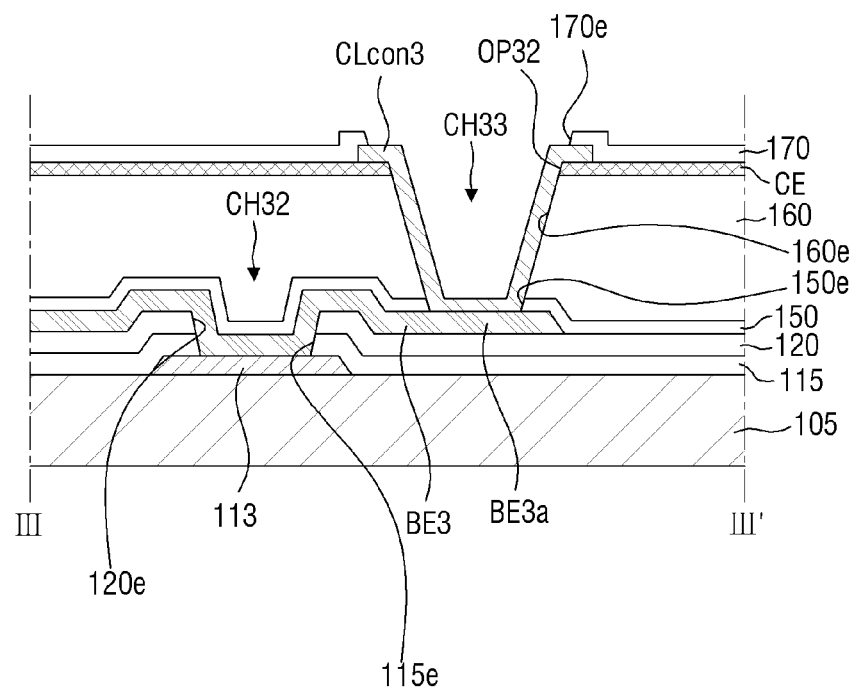

FIG. 7 is a schematic layout view illustrating the electrical connection structure of the light-blocking pattern 110 and the common wiring CL of FIG. 2. FIG. 8 is a cross-sectional view taken along the line III-III' of FIG. 7. FIGS. 9 through 11 are cross-sectional views illustrating various embodiments of the electrical connection structure of the light-blocking pattern 110 and the common wiring CL of FIG. 8. In FIG. 7, a plurality of gate wirings GL and a plurality of data wirings DL are illustrated simply as lines to show only the arrangement of the gate wirings GL and the data wirings DL.

Referring to FIGS. 7 and 8, the light-blocking pattern 110 is disposed in each row of pixels. The light-blocking pattern 110 may further include a connection terminal 113 which is located on the first base substrate 105, disposed in the non-display area NDA outside the display area DA and connected to the light-blocking line 111. In the non-display area NDA, the buffer layer 115, the gate insulating layer 120, the interlayer insulating film 150 and the planarization layer 160 may include respective through hole 115b, 120b, 150b and 160b which expose the connection terminal 113 of the light-blocking pattern 110 and overlap each other. The common electrode CE disposed on the planarization layer 160 includes a second opening OP2 which overlaps the through hole 160b of the planarization layer 160. The second opening OP2 is actually an area in which the common electrode CE is not disposed.

In the non-display area NDA, the common wiring CL and a connection electrode BE1 connected to the common wiring CL may be disposed.

The common wiring CL provides the common voltage to the common electrode CE and the light-blocking pattern 110. The common wiring CL may be disposed on the common electrode CE. In an exemplary embodiment, the common wiring CL may be shaped like a closed loop. The common wiring CL may be disposed on the common electrode CE to contact the common electrode CE and may be electrically connected to the common electrode CE. The common wiring CL may be made of a conductive material and a material having low electrical resistance, for example, a metal such as copper, molybdenum, aluminum, tungsten, chrome or titanium or an alloy including at least one of the above metals. Although not illustrated in the drawings, in another example, in a state where the common wiring CL is disposed on the common electrode CE to be insulated from the common electrode CE, the common wiring CL may be electrically connected to the common electrode CE by a connection electrode.

In the non-display area NDA of the first base substrate 105, the insulating layer 170 is disposed on the common electrode CE to cover the common wiring CL. The insulating layer 170 may further include a through hole 170b which exposes the connection terminal 113 of the light-blocking pattern 110 and overlaps the through hole 115b of the buffer layer 115. The insulating layer 170 may cover, but not necessarily, inner walls of the through hole 160b of the planarization layer 160.

The through holes 115b, 120b, 150b, 160b and 170b and the second opening OP2 may form a contact hole CH2 which connects the connection electrode BE1 to the connection terminal 113 of the light-blocking pattern 110. In addition, the insulating layer 170 may further include a contact hole CH3 which exposes the connection part CLcon of the common wiring CL adjacent to the connection terminal 113 of the light-blocking pattern 110 in the first direction D1 and connects the connection electrode BE1 to the connection part CLcon of the common wiring CL.

The connection electrode BE1 may be disposed on the insulating layer 170. The connection electrode BE1 may be electrically connected to the connection terminal 113 of the light-blocking pattern 110 by the contact hole CH2 and electrically connected to the connection part CLcon of the common wiring CL by the contact hole CH3. The connection electrode BE1 may be disposed on the same layer as the pixel electrode PE and may be made of the same material as the pixel electrode PE.

As described above, the light-blocking pattern 110 may be electrically connected to the common wiring CL by the connection electrode BE1. Accordingly, the light-blocking pattern 110 may receive the common voltage through the common wiring CL and thus maintain a constant voltage level. In this case, the drain electrode 145 electrically connected to the pixel electrode PE and the light-blocking pattern 110 may form the storage capacitor Cst2 (see FIG. 3).

FIGS. 9 through 11 are cross-sectional views illustrating various embodiments of the electrical connection structure of the light-blocking pattern 110 and the common wiring CL of FIG. 8.

Referring to FIG. 9, a connection terminal 113a of the light-blocking pattern 110 (see FIG. 7) is directly connected to the common wiring CL (see FIG. 7).

Specifically, the connection terminal 113a of the light-blocking pattern 110 may extend from the light-blocking line 111 (see FIG. 7) of the light-blocking pattern 110 (see FIG. 7) along the first direction D1 and overlap the common wiring CL (see FIG. 7) in the non-display area NDA (see FIG. 7).

In addition, the common wiring CL (see FIG. 7) is connected to the connection terminal 113a of the light-blocking pattern 110 (see FIG. 7) by a contact hole CH12. The contact hole CH12 may be formed by a contact hole 115c of the buffer layer 115, a through hole 120c of the gate insulating layer 120, a through hole 150c of the interlayer insulating film 150, a through hole 160c of the planarization layer 160 and a second opening OP12 of the common electrode CE which expose the connection terminal 113a of the light-blocking pattern 110 (see FIG. 7).

In addition, a connection part CLcon1 of the common wiring CL (see FIG. 7) may directly contact the common electrode CE, and the common wiring CL (see FIG. 7) may be electrically connected to the common electrode CE by the connection part CLcon1.

The insulating layer 170 may include a through hole 170c which exposes the connection part CLcon1 of the common wiring CL (see FIG. 7).

Referring to FIG. 10, the connection terminal 113 of the light-blocking pattern 110 (see FIG. 7) is connected to the common wiring CL (see FIG. 7) by a connection electrode BE2 disposed on the same layer as the gate wiring GL (see FIG. 7).

Specifically, the buffer layer 115 further includes a contact hoe CH22 which exposes the connection terminal 113 of the light-blocking pattern 110 (see FIG. 7). In this case, the connection electrode BE2 is located on the buffer layer 115 and connected to the connection terminal 113 of the light-blocking pattern 110 (see FIG. 7) by the contact hole CH22.

The gate insulating layer 120 is disposed on the buffer layer 115 to cover the connection electrode BE2 and includes a through hole 120d which exposes a connection part BE2a of the connection electrode BE2 which does not overlap the connection terminal 113 of the light-blocking pattern 110 (see FIG. 7).

The interlayer insulating film 150 is disposed on the gate insulating layer 120 and includes a through hole 150d which overlaps the through hole 120d of the gate insulating layer 120.

The planarization layer 160 includes a through hole 150d which overlaps the through hole 150d of the interlayer insulating film 150. The common electrode CE disposed on the planarization layer 160 includes a second opening OP22 which overlaps the through hole 150d of the planarization layer 160.

The through holes 120d, 150d and 150d and the second opening OP22 form a contact hole CH23.

In addition, a connection part CLcon2 of the common wiring CL (see FIG. 7) is physically and electrically connected to the connection part BE2a of the connection electrode BE2 by the contact hole CH23. The insulating layer 170 may include a through hole 170d which exposes the connection part CLcon2 of the common wiring CL (see FIG. 7).

Referring to FIG. 11, the connection terminal 113 of the light-blocking pattern 110 (see FIG. 7) is connected to the common wiring CL (see FIG. 7) by a connection electrode BE3 disposed on the same layer as the data wiring DL (see FIG. 7).

Specifically, the buffer layer 115 includes a through hole 115e which exposes the connection terminal 113 of the light-blocking pattern 110 (see FIG. 7), and the gate insulating layer 120 includes a through hole 120e which overlaps the through hole 115e of the buffer layer 115. The through holes 115e and 120e form a contact hole CH32. In this case, the connection electrode BE3 is electrically connected to the connection terminal 113 of the light-blocking pattern 110 (see FIG. 7) by the contact hole CH32.

The interlayer insulating film 150 is disposed on the gate insulating layer 120 to cover the connection electrode BE3 and includes a through hole 150e. The through hole 150e exposes a connection part BE3a of the connection electrode BE3 which does not overlap the connection terminal 113 of the light-blocking pattern 110 (see FIG. 7). The planarization layer 160 is disposed on the interlayer insulating film 150 and includes a through hole 160e which overlaps the through hole 150e of the interlayer insulating film 150.

The common electrode CE disposed on the planarization layer 160 includes a second opening OP32 which overlaps the through hole 160e of the planarization layer 160. The through holes 150e and 160e and the second opening OP32 form a contact hole CH33.

A connection part CLcon3 of the common wiring CL (see FIG. 7) is physically and electrically connected to the connection part BE3a of the connection electrode BE3 by the contact hole CH33. The insulating layer 170 may include a through hole 170e which exposes the connection part CLcon3 of the common wiring CL.

As described above, the display device 10 according to the current embodiment includes the light-blocking pattern 110 having the light-blocking line 111 which maintains a constant voltage level by receiving the common voltage and the light-blocking protrusion 112 which overlaps the gate wiring GL by a predetermined width and overlaps the drain electrode 145. Therefore, the storage capacitor Cst2 can be formed in addition to the storage capacitor Cst1 formed between the pixel electrode PE and the common electrode CE. Furthermore, the light-blocking pattern 110 included in the display device 10 according to the current embodiment can reduce the overlap area between the gate wiring GL and the drain electrode 145, thereby reducing the parasitic capacitance Cgd formed by the overlap of the gate wiring GL and the drain electrode 145. That is, the display device 10 according to the current embodiment can reduce a kickback voltage by forming the additional storage capacitor Cst2 and reducing the parasitic capacitance Cgd.

Accordingly, this can reduce the flickering of the display device 10 when driven and improve the display quality of the display device 10.

In addition, since the light-blocking pattern 110 is electrically connected to the common electrode CE in the display device 10, resistance components can be reduced when the common voltage is applied to the common electrode CE. Furthermore, the parasitic capacitance formed between the light-blocking pattern 110 and an adjacent component such as the gate electrode GE or the source region 121 of the semiconductor pattern 130 can be reduced. Therefore, the ripple phenomenon in which the common voltage applied to the common electrode CE fluctuates when a data voltage applied to the pixel electrode PE swings can be reduced, and a reduction in the operation reliability of the thin-film transistor TFT1 (see FIG. 2 or 3) can be prevented by reducing the parasitic capacitance between the gate electrode GE and the semiconductor pattern 130.

Figure 12:
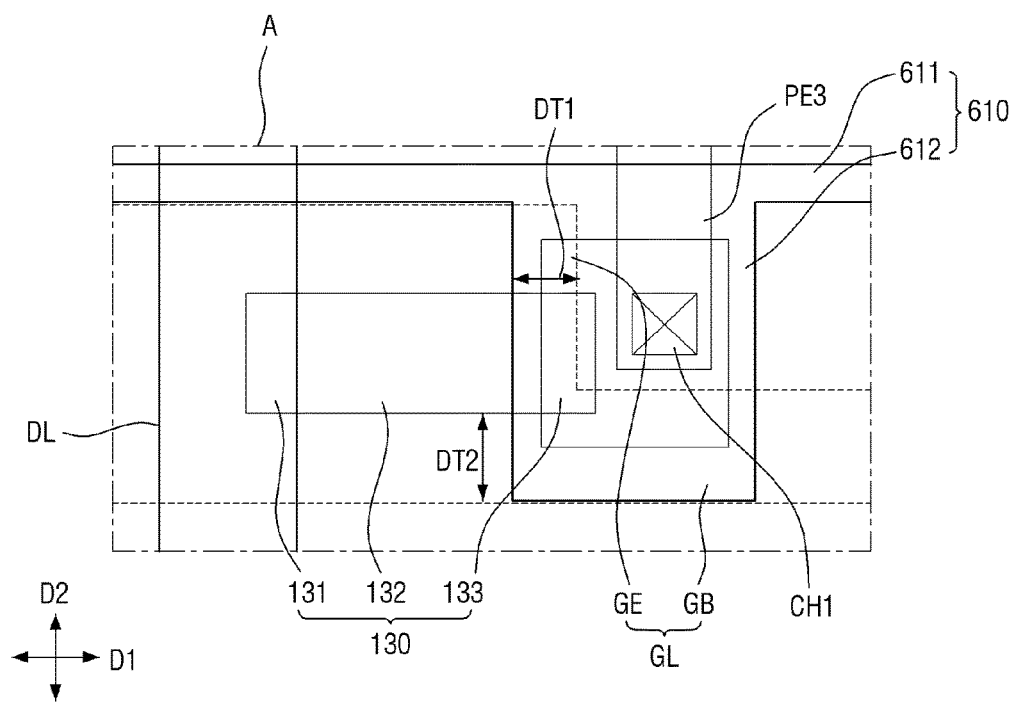
FIG. 12 is a layout view of a portion of a display device according to an embodiment.

FIG. 12 is a layout view of a portion of a display device according to an embodiment which corresponds to FIG. 6.

The display device according to the current embodiment is identical to the display device 10 of FIGS. 1 through 11 except for a light-blocking pattern 610. Therefore, the display device according to the current embodiment will be described, focusing mainly on the light-blocking pattern 610.

Referring to FIG. 12, the light-blocking pattern 610 includes a light-blocking line 611 and a light-blocking protrusion 612 and is similar to the light-blocking pattern 110 of FIG. 6.

However, the light-blocking pattern 610 is different from the light-blocking pattern 110 of FIG. 6 in that the light-blocking line 611 does not overlap a gate electrode GE of a gate wring layer GL. In this case, the parasitic capacitance formed by the overlap of the light-blocking line 611 and the gate electrode GE can be reduced, and a reduction in the operation reliability of a thin-film transistor TFT1 (see FIG.

2 or 3) due to the parasitic capacitance formed between the light-blocking line 611 and the gate electrode GE can be prevented.

Figure 13:
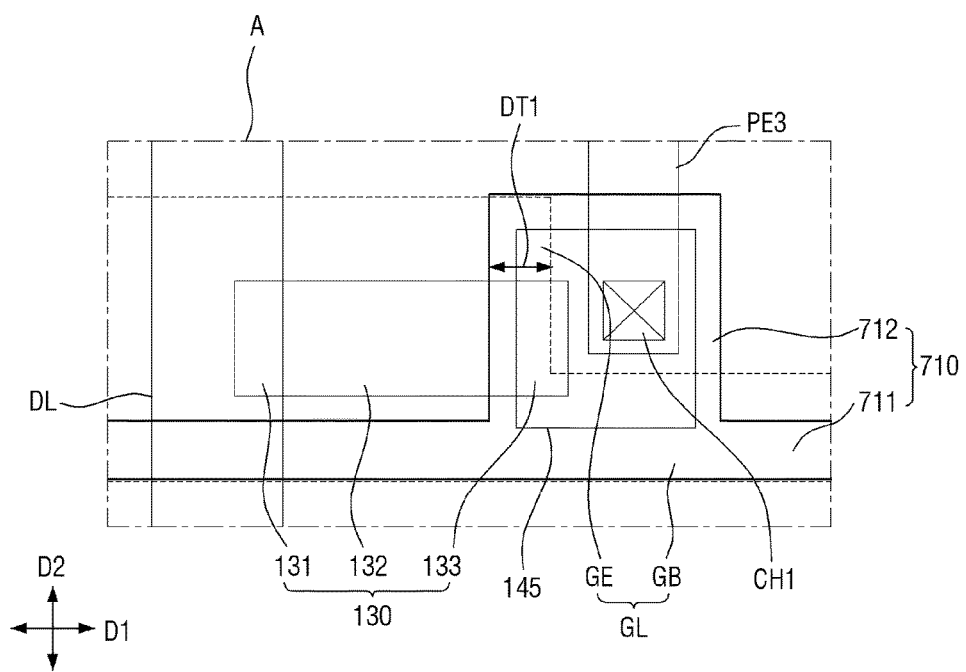
FIG. 13 is a layout view of a portion of a display device according to an embodiment.

FIG. 13 is a layout view of a portion of a display device according to an embodiment which corresponds to FIG. 6.

The display device according to the current embodiment is identical to the display device 10 of FIGS. 1 through 11 except for a light-blocking pattern 710. Therefore, the display device according to the current embodiment will be described, focusing mainly on the light-blocking pattern 710.

Referring to FIG. 13, the light-blocking pattern 710 includes a light-blocking line 711 and a light-blocking protrusion 712 and is similar to the light-blocking pattern 110 of FIG. 6.

However, the light-blocking pattern 710 is different from the light-blocking pattern 110 of FIG. 6 in that the light-blocking line 711 overlaps a gate line GB of a gate wiring GL and that the light-blocking protrusion 712 protrudes in the same direction as a gate electrode GE.

The display device including the light-blocking pattern 710 may provide the same effect as the display device 10 of FIGS. 1 through 11.

Figure 14:
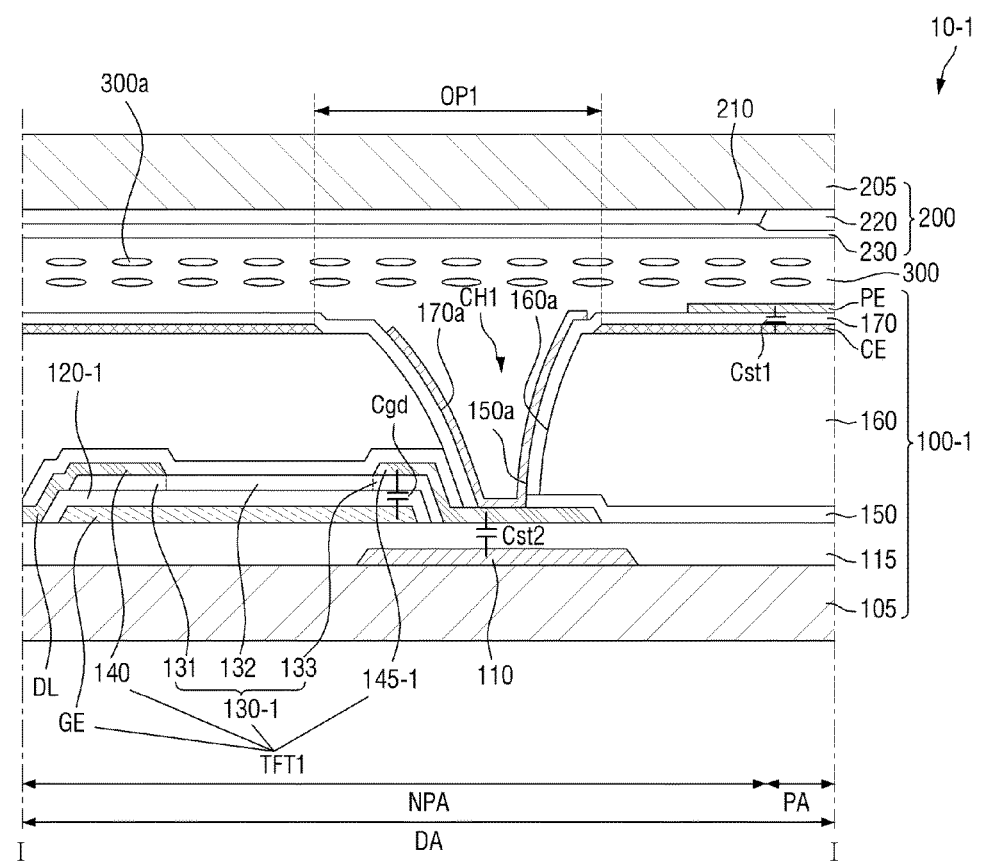
FIG. 14 and FIG. 15 are cross-sectional views of portions of a display device according to one or more embodiments.
Figure 15:
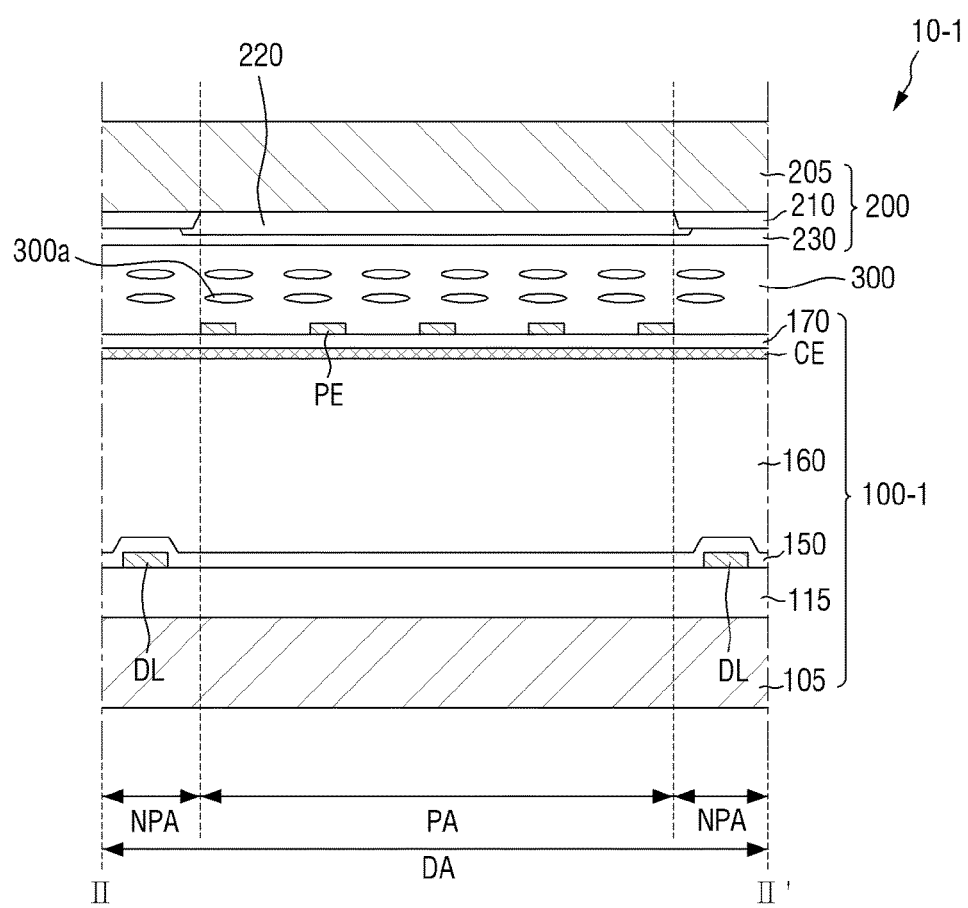

FIGS. 14 and 15 are cross-sectional views of portions of a display device 10-1 according to an embodiment which correspond to FIGS. 3 and 4.

The display device 10-1 according to the current embodiment is identical to the display device 10 of FIGS. 1 through 11 except for a gate insulating layer 120-1, a semiconductor pattern 130-1, and a drain electrode 145-1. Therefore, the display device 10-1 according to the current embodiment will be described, focusing mainly on the gate insulating layer 120-1, the semiconductor pattern 130-1, and the drain electrode 145-1.

Referring to FIGS. 14 and 15, a first display substrate 100-1 includes a first base substrate 105, a light-blocking pattern 110, a buffer layer 115, a gate wiring GL, the gate insulating layer 120-1, the semiconductor pattern 130-1, a data wiring DL, the drain electrode 145-1, an interlayer insulating film 150, a planarization layer 160, a pixel electrode PE, an insulating layer 170 and a common electrode CE.

The gate insulating layer 120-1 is similar to the gate insulating layer 120 of FIG. 3. However, the gate insulating layer 120-1 is disposed only on an area of the first base substrate 105, specifically, the buffer layer 115 which overlaps the gate wiring GL (see FIG. 2). That is, the gate insulting layer 120-1 may be disposed not on the whole surface of the buffer layer 115 but within a range which covers the gate wiring GL including a gate electrode GE.

The semiconductor pattern 130-1 is similar to the semiconductor pattern 130 of FIG. 3. However, the semiconductor pattern 130-1 may contact the buffer layer 115 due to the disposition of the gate insulating layer 120-1.

The drain electrode 145-1 is similar to the drain electrode 145 of FIG. 3. However, the drain electrode 145-1 may contact the buffer layer 115 due to the disposition of the gate insulating layer 120-1 and the semiconductor pattern 130-1. In this case, unlike in FIG. 3, the gate insulating layer 120-1 is not located between the light-blocking pattern 110 and the drain electrode 145-1. Therefore, a gap between the light-blocking pattern 110 and the drain electrode 145-1 is reduced, thereby increasing the capacitance of a storage capacitor Cst2 formed between the light-blocking pattern 110 and the drain electrode 145.

The display device 10-1 including the gate insulating layer 120-1 can reduce a kickback voltage by ensuring the formation of the storage capacitor Cst2 in addition to a storage capacitor Cst1 formed between the pixel electrode PE and the common electrode CE.

Figure 16:
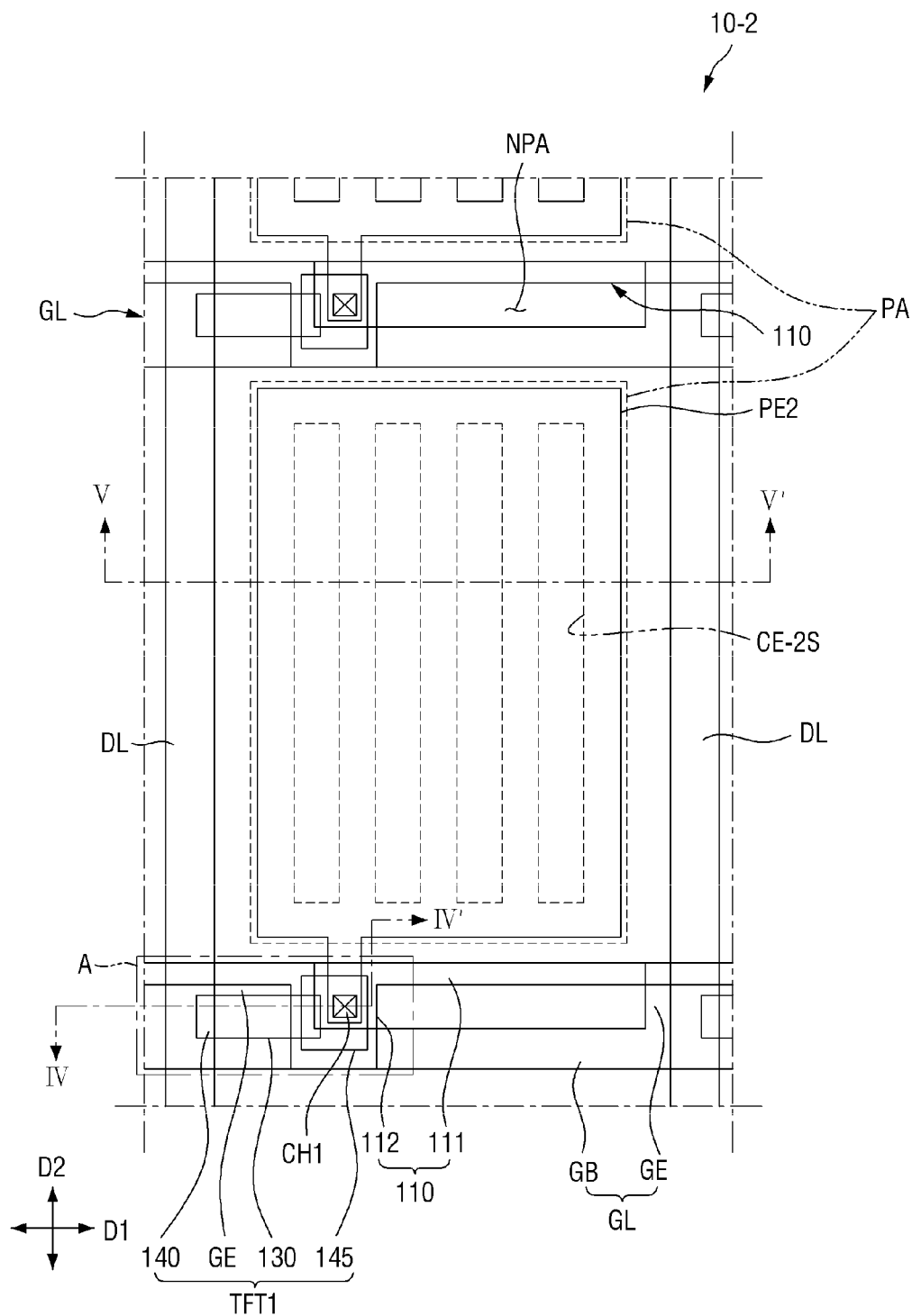
FIG. 16 is a plan view of a portion of a display device according to an embodiment which corresponds to FIG. 2 according to an embodiment.
Figure 17:
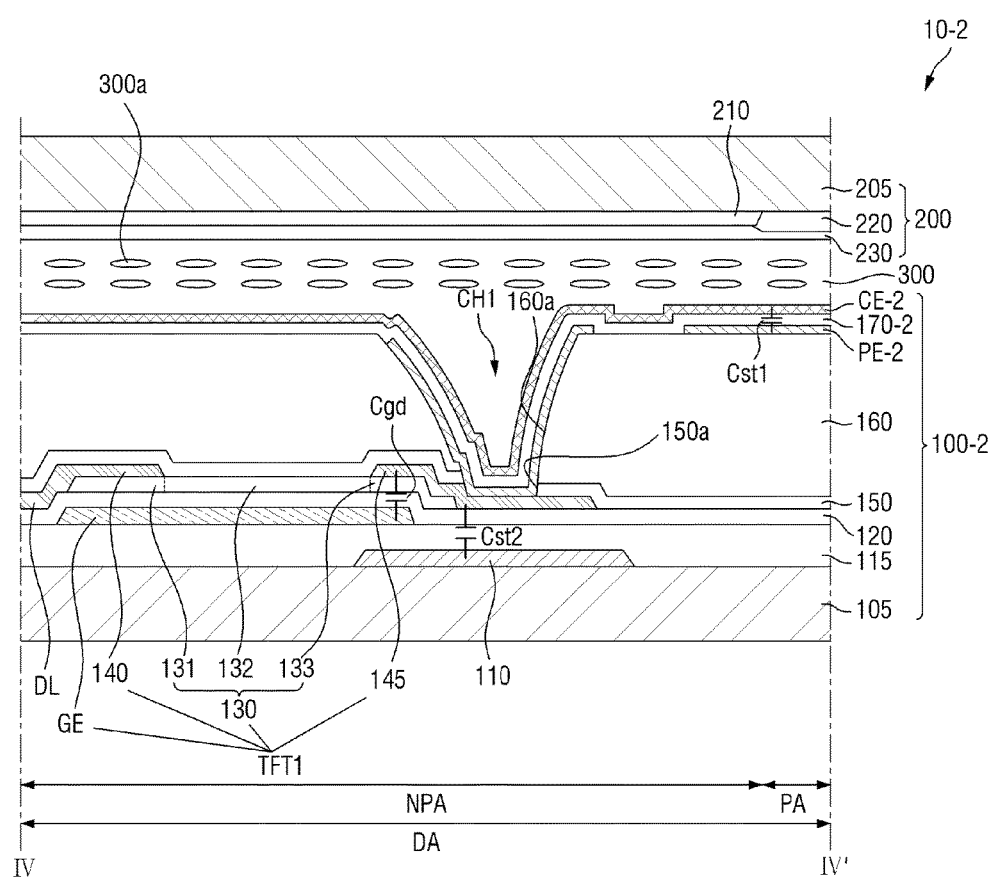
FIG. 17 is a cross-sectional view taken along the line IV-IV' of FIG. 16 according to an embodiment.
Figure 18:
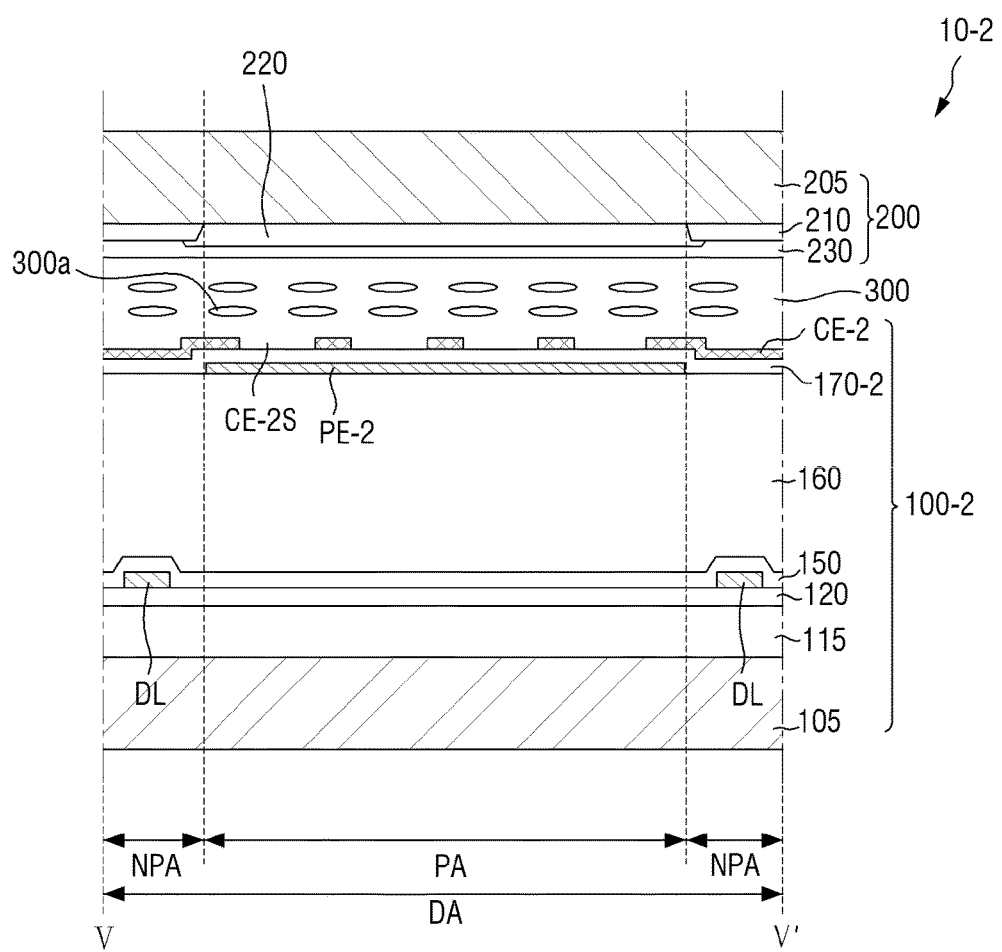
FIG. 18 is a cross-sectional view taken along the line V-V' of FIG. 16 according to an embodiment.

FIG. 16 is a plan view of a portion of a display device 10-2 according to an embodiment which corresponds to FIG. 2. FIG. 17 is a cross-sectional view taken along the line IV-IV' of FIG. 16. FIG. 18 is a cross-sectional view taken along the line V-V' of FIG. 16.

The display device 10-2 according to the current embodiment is identical to the display device 10 of FIGS. 1 through 11 except for a pixel electrode PE-2, an insulating layer 170-2, and a common electrode CE-2. Therefore, the display device 10-2 according to the current embodiment will be described, focusing mainly on the pixel electrode PE-2, the insulating layer 170-2, and the common electrode CE-2.

Referring to FIGS. 16 through 18, a first display substrate 100-2 includes a first base substrate 105, a light-blocking pattern 110, a buffer layer 115, a gate wiring GL, a gate insulating layer 120, a semiconductor pattern 130, a data wiring DL, a drain electrode 145, an interlayer insulating film 150, a planarization layer 160, the pixel electrode PE-2, the insulating layer 170-2, and the common electrode CE-2.

The pixel electrode PE-2 is similar to the pixel electrode PE of FIGS. 3 and 4. However, the pixel electrode PE-2 is disposed on the planarization layer 160. The pixel electrode PE-2 may be formed as a single piece.

The insulating layer 170-2 is similar to the insulating layer 170 of FIGS. 3 and 4. However, the insulating layer 170-2 is disposed on the pixel electrode PE-2.

The common electrode CE-2 is similar to the common electrode CE of FIGS. 3 and 4. However, the common electrode CE-2 is disposed on the insulating layer 170-2 and may include a plurality of slits CE-2S in each light-transmitting area PA.

The display device 10-2 may provide the same effect as the display device 10 of FIGS. 1 through 11.

Figure 19:
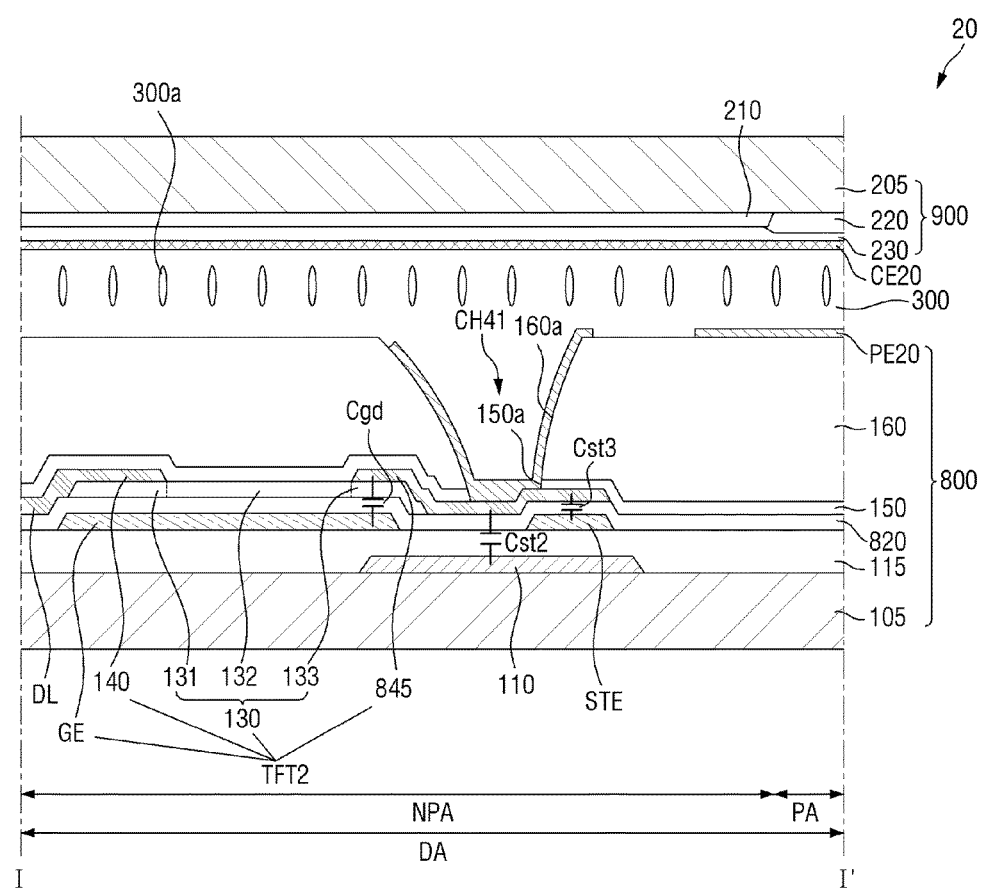
FIG. 19 and FIG. 20 are cross-sectional views of portions of a display device according to one or more embodiments.
Figure 20:
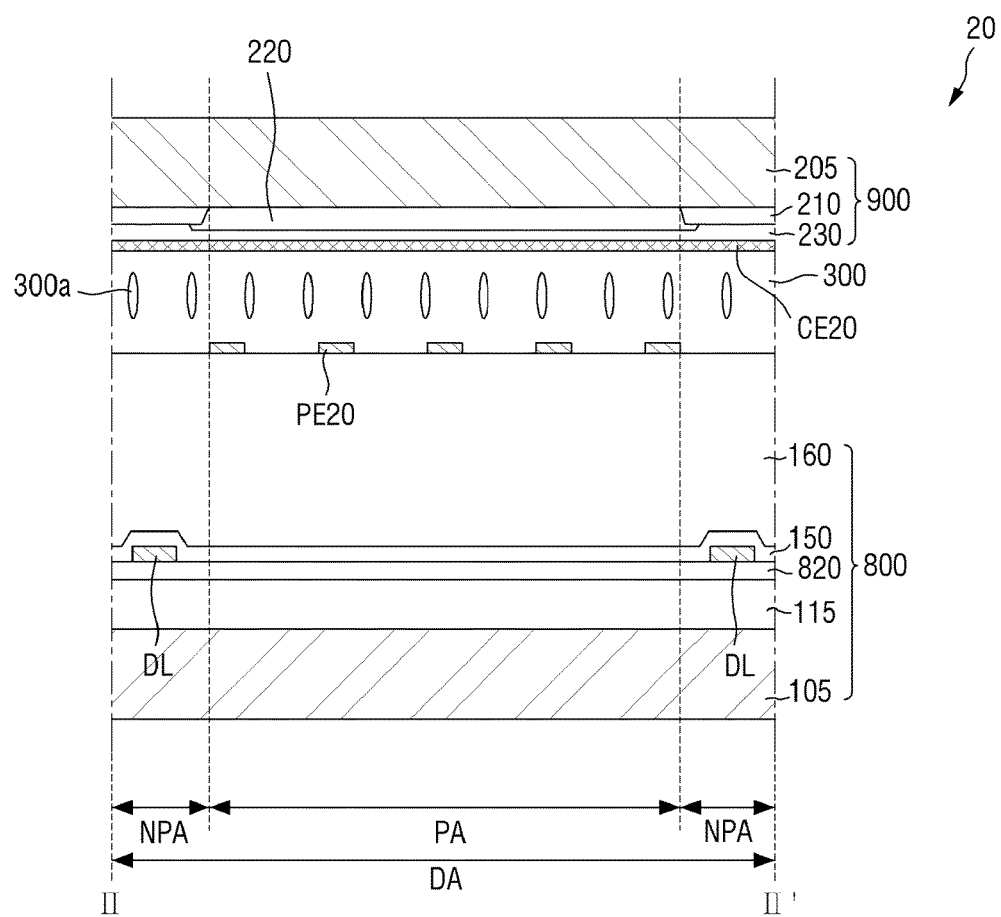

FIGS. 19 and 20 are cross-sectional views of portions of a display device 20 according to an embodiment which correspond to FIGS. 3 and 4.

The display device 20 according to the current embodiment is identical to the display device 10 of FIGS. 1 through 11 except for the disposition of a common electrode CE20. Therefore, the display device 20 according to the current embodiment will be described, focusing mainly on components that vary according to the disposition of the common electrode CE20.

Referring to FIGS. 19 and 20, the display device 20 according to the current embodiment may include a first display substrate 800, a second display substrate 900 which faces the first display substrate 800, and a liquid crystal layer 300 which is disposed between the first display substrate 800 and the second display substrate 900.

The first display substrate 800 includes a first base substrate 105, a light-blocking pattern 110, a buffer layer 115, a gate wiring GL (see FIG. 2), a storage electrode STE, a gate insulating layer 820, a semiconductor pattern 130, a data wiring DL, a drain electrode 845, an interlayer insulating film 150, a planarization layer 160, and a pixel electrode PE20.

The storage electrode STE may be formed on the same layer as the gate wiring GL (see FIG. 2) and made of the same material as the gate wiring GL. The storage electrode STE overlaps the drain electrode 845 with the gate insulating layer 820 interposed between them, thereby forming a storage capacitor Cst3.

The gate insulating layer 820 is similar to the gate insulating layer 120 of FIGS. 3 and 4. However, the gate insulating layer 820 may cover the gate wiring GL (see FIG. 2) and the storage electrode STE.

The drain electrode 845 is similar to the drain electrode 145 of FIG. 3. However, the drain electrode 845 may overlap the storage electrode STE.

The pixel electrode PE20 is similar to the pixel electrode PE20 of FIGS. 3 and 4. However, the pixel electrode PE20 may be disposed on the planarization layer 160.

The second display substrate 900 may include a second base substrate 205, a light-blocking member 210, a color filter 220, an overcoating layer 230, and a common electrode CE20.

The common electrode CE20 is similar to the common electrode CE of FIGS. 3 and 4. However, the common electrode CE20 is disposed on a surface of the second base substrate 205 which faces the first display substrate 800, more specifically, disposed on the overcoating layer 230.

The electrical connection structure of the light-blocking pattern 110 and a common wiring CL1 of the display device 20 will now be described in detail.

Figure 21:
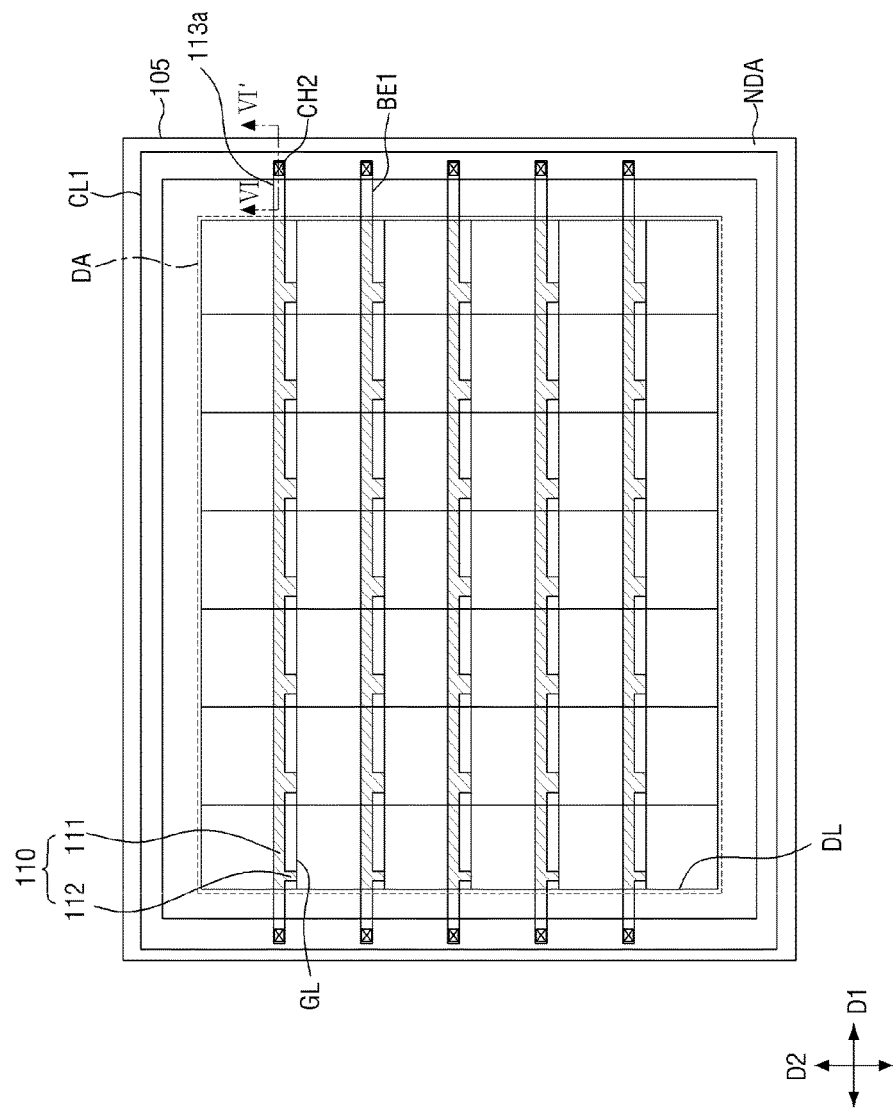
FIG. 21 is a schematic layout view illustrating electrical connection structures of a light-blocking pattern and a common wiring of FIG. 19 according to an embodiment.
Figure 22:
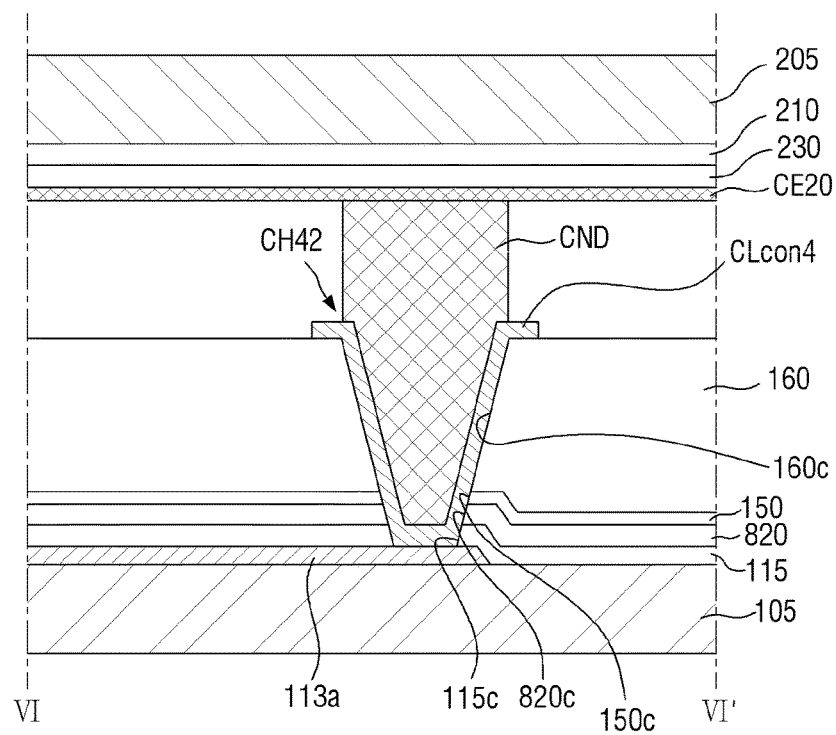
FIG. 22 is a cross-sectional view taken along the line VI-VI' of FIG. 21 according to an embodiment.

FIG. 21 is a schematic layout view illustrating the electrical connection structure of the light-blocking pattern 110 and the common wiring CL1 of FIG. 19. FIG. 22 is a cross-sectional view taken along the line VI-VI' of FIG. 21. In FIG. 21, a plurality of gate wirings GL and a plurality of data wirings DL are illustrated simply as lines to show only the arrangement of the gate wirings GL and the data wirings DL.

Referring to FIGS. 21 and 22, the light-blocking pattern 110 is disposed in each row of pixels. The light-blocking pattern 110 may further include a connection terminal 113a which is located on the first base substrate 105 and disposed in a non-display area NDA. The connection terminal 113a is connected to a light-blocking line 111 of the light-blocking pattern 110.

In the non-display area NDA, the buffer layer 115 is disposed on the first base substrate 105 to cover the connection terminal 113a and may further include a through hole 115c which exposes the connection terminal 113a of the light-blocking pattern 110.

The gate insulating layer 820 may further include a through hole 820c which exposes the connection terminal 113a of the light-blocking pattern 110 and overlaps the through hole 115c of the buffer layer 115.

The interlayer insulating film 150 may further include a through hole 150c which exposes the connection terminal 113a of the light-blocking pattern 110 and overlaps the through hole 115c of the buffer layer 115.

The planarization layer 160 is disposed on the interlayer insulating film 150 and may further include a through hole 160c which exposes the connection terminal 113a of the light-blocking pattern 110 and overlaps the through hole 150c of the interlayer insulating film 150.

The through holes 115c, 820c, 150c and 160c may form one contact hole CH42.

The common wiring CL1 delivers a common voltage to the light-blocking pattern 110 and may be disposed on the planarization layer 160. In an example, the common wiring CL1 may be disposed on the same layer as the pixel electrode CE20 (see FIG. 19). In an exemplary embodiment, the common wiring CL1 may be shaped like a closed loop. The common wiring CL1 may be made of a conductive material, for example, a metal such as copper, molybdenum, aluminum, tungsten, chrome or titanium or an alloy including at least one of the above metals. Alternatively, the common wiring CL1 may be made of the same material as the pixel electrode PE20 (see FIG. 19). The common wiring CL1 includes a connection part CLcon4 which is connected to the connection terminal 113a of the light-blocking pattern 110 by the contact hole CH42.

A conductor CND is disposed between the connection part CLcon4 of the common wiring CL1 and the common electrode CE20 and provides the common voltage to the common electrode CE20. The conductor CND may be made of a conductive material.

As described above, the light-blocking pattern 110 may be electrically connected to the common wiring CL1. Accordingly, the light-blocking pattern 110 may receive the common voltage through the common wiring CL1, and the drain electrode 845 (see FIG. 19) and the light-blocking pattern 110 may form the storage capacitor Cst3 (see FIG. 19).

Figure 23:
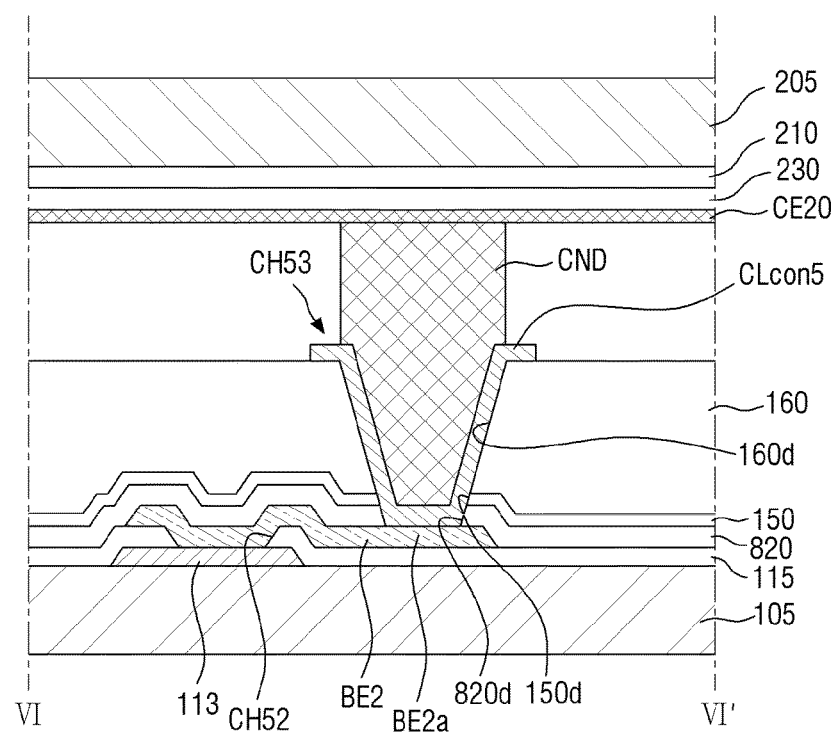
FIG. 23 and FIG. 24 are cross-sectional views illustrating various embodiments of electrical connection structures of the light-blocking pattern and the common wiring of FIG. 22.
Figure 24:
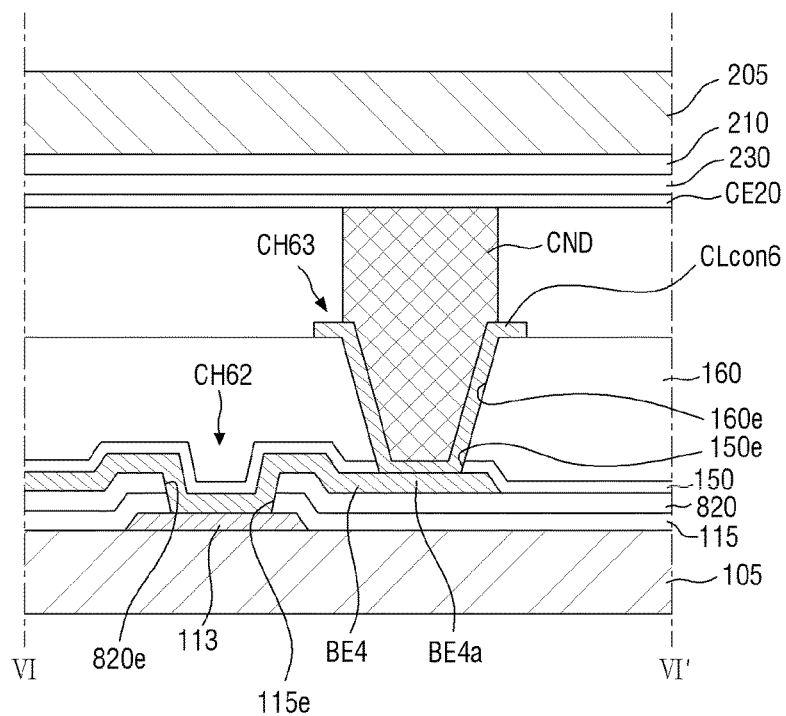

FIGS. 23 and 24 are cross-sectional views illustrating various embodiments of the electrical connection structure of the light-blocking pattern 110 and the common wiring CL1 of FIG. 22.

Referring to FIG. 23, the connection terminal 113 of the light-blocking pattern 110 (see FIG. 21) is connected to the common wiring CL1 (see FIG. 21) by a connection electrode BE2 disposed on the same layer as the gate wiring GL (see FIG. 21).

Specifically, the buffer layer 115 further includes a contact hole CH52 which exposes the connection terminal 113 of the light-blocking pattern 110. In this case, the connection electrode BE2 is connected to the connection terminal 113 of the light-blocking pattern 110 (see FIG. 21) by the contact hole CH52 and extends in the first direction D1 in the non-display area NDA (see FIG. 21) of the first base substrate 105. The gate insulating layer 820 is disposed on the buffer layer 115 to cover the connection electrode BE2 and includes a through hole 820d which exposes a connection part BE2a of the connection electrode BE2 which does not overlap the connection terminal 113 of the light-blocking pattern 110 (see FIG. 21). The interlayer insulating film 150 is disposed on the gate insulating layer 120 and includes a through hole 150d which overlaps the through hole 820d of the gate insulating layer 820. The planarization layer 160 includes a through hole 150d which overlaps the through hole 150d of the interlayer insulating film 150. The through holes 820d, 150d and 150d form a contact hole CH53.

In addition, a connection part CLcon5 of the common wiring CL1 (see FIG. 21) is connected to the connection part BE2a of the connection electrode BE2 by the contact hole CH53.

Referring to FIG. 24, the connection terminal 113 of the light-blocking pattern 110 (see FIG. 21) is connected to the common wiring CL1 (see FIG. 21) by a connection electrode BE4 disposed on the same layer as a data wiring DL (see FIG. 21).

Specifically, the buffer layer 115 includes a through hole 115e which exposes the connection terminal 113 of the light-blocking pattern 110 (see FIG. 21), and the gate insulating layer 820 includes a through hole 820e which overlaps the through hole 115e of the buffer layer 115. The through holes 115e and 820e form a contact hole CH62. In this case, the connection electrode BE4 is electrically connected to the connection terminal 113 of the light-blocking pattern 110 (see FIG. 21) by the contact hole CH62 and extends along the first direction D1 in the non-display area NDA (see FIG. 21) of the first base substrate 105. The interlayer insulating film 150 is disposed on the gate insulating layer 820 to cover the connection electrode BE4 and includes a through hole 150e which exposes a connection part BE4a of the connection electrode BE4 which does not overlap the connection terminal 113 of the light-blocking pattern 110 (see FIG. 21). The planarization layer 160 includes a through hole 160e which overlaps the through hole 150e of the interlayer insulating film 150.

In addition, a connection part CLcon6 of the common wiring CL1 (see FIG. 21) is electrically connected to the connection part BE4a of the connection electrode BE4 by a contact hole CH63.

As described above, the display device 20 according to the current embodiment includes the light-blocking pattern 110 having the light-blocking line 111 which maintains a constant voltage level by receiving the common voltage and a light-blocking protrusion 112 which overlaps the gate wiring GL by a predetermined width and overlaps the drain electrode 845. In addition, the display device 20 according to the current embodiment includes the common electrode CE20 disposed on the second display substrate 900. Therefore, the generation of a kickback voltage can be reduced in the display device 20 in which the common electrode CE20 is disposed on the second display substrate 900.

Accordingly, this can reduce the flickering of the display device 20 when driven and improve the display quality of the display device 20.

In addition, since the light-blocking pattern 110 is electrically connected to the common electrode CE20 in the display device 20, resistance components can be reduced when the common voltage is applied to the common electrode CE20. Furthermore, the parasitic capacitance formed between the light-blocking pattern 110 and an adjacent component can be reduced.

Therefore, the ripple phenomenon in which the common voltage applied to the common electrode CE20 fluctuates when a data voltage applied to the pixel electrode PE20 swings can be reduced, and a reduction in the operation reliability of a thin-film transistor TFT2 (see FIG. 19) can be prevented by reducing the parasitic capacitance between the gate electrode GE and the semiconductor pattern 130.

A display device according to an embodiment can display images with satisfactory quality because the kickback voltage may be minimized.

Those skilled in the art will appreciate that many variations and modifications can be made to the described embodiments. The described embodiments are provided as examples and are not for purposes of limitation.

What is claimed is:

1. A display device comprising: a first base substrate; a light-blocker disposed on the first base substrate, the light-blocker comprising a light-blocking line extending in a first direction and a light-blocking protrusion protruding from the light-blocking line in a second direction different from the first direction; a gate wiring, which comprises a gate line extending in the first direction and a gate electrode protruding from the gate line; a semiconductor member, which overlaps the gate electrode and comprises a source region, a drain region, and a channel region between the source region and the drain region; a data wiring, which extends in the second direction and is electrically connected to the source region; and a drain electrode, which is separated from the data wiring and is electrically connected to the drain region, wherein the light-blocking protrusion partially overlaps the gate wiring, and wherein an edge of the gate electrode in the first direction is located in an overlap area between the drain region and the light-blocking protrusion; wherein the light-blocking layer is under the gate electrode; a pixel electrode, which is electrically connected to the drain electrode; and a common electrode, which is located between the drain electrode and the pixel electrode, is insulated from the drain electrode and the pixel electrode, and is electrically connected to the light-blocking protrusion.

2. The display device of claim 1, wherein the gate electrode and the light-blocking protrusion partially overlap each other, and wherein a width by which the gate electrode and the light-blocking protrusion overlap each other in the first direction is in a range of 0.5 µm to 3 µm.

3. The display device of claim 1, wherein the gate electrode and the light-blocking protrusion partially overlap each other, and wherein the light-blocking protrusion completely overlaps the semiconductor member that extends in the second direction.

4. The display device of claim 3, wherein a distance between an edge of the semiconductor member and an edge of the light-blocking protrusion which face each other in the second direction is in the range of about 1 µm to 3 µm.

5. The display device of claim 1, wherein whole of the drain electrode overlaps the light-blocker.

6. The display device of claim 1, wherein the light-blocking line and the gate line are spaced from each other in a plan view of the display device, and wherein the light-blocking protrusion and the gate electrode are positioned between the light-blocking line and the gate line in the plan view of the display device.

7. The display device of claim 1, wherein the light-blocking line does not overlap the gate wiring layer, and the light-blocking protrusion protrudes in an opposite direction to a direction in which the gate electrode protrudes in the second direction.

8. The display device of claim 1, wherein the light-blocking line overlaps the gate line, and wherein the light-blocking protrusion overlaps the gate electrode.

9. The display device of claim 1, comprising:
a pixel electrode, which is electrically connected to the drain electrode;
a common electrode, which is disposed between the drain electrode and the pixel electrode, is insulated from the drain electrode and the pixel electrode, and comprises a first opening; and
a common wiring, which is electrically connected to the common electrode and comprises a connection part,
wherein the pixel electrode is electrically connected to the drain electrode through the first opening, and wherein the light-blocker comprises a connection terminal electrically connected to the light-blocking line.

10. The display device of claim 9, further comprising a connection electrode, wherein a material of the connection electrode is identical to a material of the pixel electrode, wherein the common electrode comprises a second opening, which exposes the connection terminal, and wherein the connection electrode extends through the second opening and electrically connects the connection terminal to the connection part.

11. The display device of claim 9, wherein the common electrode comprises a second opening which exposes the connection terminal, and the connection part is electrically connected to the connection terminal by the second opening.

12. The display device of claim 9, further comprising:
a buffer layer, which is disposed between the light-blocker and the gate wiring and comprises a contact hole exposing the connection terminal; and
a connection electrode, which is formed of a same material as the gate wiring and is electrically connected to the connection terminal through the contact hole,
wherein the common electrode comprises a second opening which exposes the connection electrode, and the connection part is electrically connected to the connection electrode by the second opening.

13. The display device of claim 9, comprising:
a gate insulating layer, which is disposed between the light-blocker and the data wiring and comprises a contact hole exposing the connection terminal; and
a connection electrode, which is formed of a same material as the data wiring and is electrically connected to the connection terminal through the contact hole,
wherein the common electrode comprises a second opening exposing the connection electrode, and the connection part is electrically connected to the connection electrode by the second opening.

14. The display device of claim 1, further comprising: a buffer layer, which is disposed between the light-blocker and the gate wiring, wherein a portion of the drain electrode directly contacts the buffer layer, and wherein whole of the portion of the drain electrode overlaps the light-blocker.

15. The display device of claim 1, further comprising:
a planarization layer, which comprises a through hole exposing the drain electrode;
a pixel electrode, which is disposed on the planarization layer and is electrically connected to the drain electrode through the through hole;
an insulating layer, which is disposed on the pixel electrode, wherein a portion of the insulating layer is positioned inside the through hole; and
a common electrode, which is disposed on the insulating layer.

16. The display device of claim 1, further comprising:
a planarization layer, which comprises a first through hole exposing the drain electrode;
a pixel electrode, which is disposed on the planarization layer and is electrically connected to the drain electrode through the first through hole;
a common wiring, which is disposed on the planarization layer, is insulated from the pixel electrode, and comprises a connection part;
a second base substrate, which is separated from the first base substrate;
a common electrode, which is disposed on the second base substrate; and
a conductor, which is disposed between the common electrode and the connection part,
wherein the light-blocker comprises a connection terminal connected to the light-blocking line.

17. The display device of claim 16, wherein the planarization layer comprises a second through hole, which exposes the connection terminal, and wherein the connection part is electrically connected to the connection terminal through the second through hole.

18. The display device of claim 16, further comprising:
a buffer layer, which is disposed between the light-blocker and the gate wiring and comprises a contact hole exposing the connection terminal; and
a connection electrode, which is formed of a same material as the gate wiring and directly contacts the connection terminal through the contact hole,
wherein the planarization layer comprises a second through hole exposing the connection electrode, and wherein the connection part is electrically connected to the connection electrode through the second through hole.

19. The display device of claim 16, further comprising:
a gate insulating layer, which is disposed between the light-blocker and the data wiring and comprises a contact hole exposing the connection terminal; and
a connection electrode, which is formed of a same material as the data wiring and is electrically connected to the connection terminal through the contact hole,
wherein the planarization layer comprises a second through hole exposing the connection electrode, and wherein the connection part is electrically connected to the connection electrode through the second through hole.

* * * * *